US012173157B2

(12) United States Patent
Yamazaki

(10) Patent No.: US 12,173,157 B2
(45) Date of Patent: Dec. 24, 2024

(54) CURABLE SILICONE COMPOSITION, CURED PRODUCT THEREOF, AND METHOD FOR PRODUCING SAME

(71) Applicant: DOW TORAY CO., LTD., Tokyo (JP)

(72) Inventor: Ryosuke Yamazaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 660 days.

(21) Appl. No.: 17/418,375

(22) PCT Filed: Dec. 27, 2019

(86) PCT No.: PCT/JP2019/051392
§ 371 (c)(1),
(2) Date: Jun. 25, 2021

(87) PCT Pub. No.: WO2020/138409
PCT Pub. Date: Jul. 2, 2020

(65) Prior Publication Data
US 2022/0064447 A1 Mar. 3, 2022

(30) Foreign Application Priority Data
Dec. 27, 2018 (JP) .................................. 2018-245659

(51) Int. Cl.
| | | |
|---|---|---|
| *C08L 83/04* | (2006.01) | |
| *C08G 77/00* | (2006.01) | |
| *C08G 77/20* | (2006.01) | |
| *C08G 77/44* | (2006.01) | |
| *C08J 3/12* | (2006.01) | |
| *C08K 3/22* | (2006.01) | |
| *C08K 5/14* | (2006.01) | |
| *C08K 9/06* | (2006.01) | |

(52) U.S. Cl.
CPC .............. *C08L 83/04* (2013.01); *C08G 77/20* (2013.01); *C08G 77/44* (2013.01); *C08G 77/80* (2013.01); *C08J 3/12* (2013.01); *C08K 3/22* (2013.01); *C08K 5/14* (2013.01); *C08K 9/06* (2013.01); *C08G 2170/20* (2013.01); *C08K 2003/2241* (2013.01); *C08K 2201/001* (2013.01); *C08L 2203/20* (2013.01); *C08L 2205/025* (2013.01); *C08L 2205/03* (2013.01); *C08L 2205/18* (2013.01)

(58) Field of Classification Search
CPC .................. C08L 83/04; C08L 2203/20; C08L 2205/025; C08L 2205/03; C08L 2205/18; C08G 77/20; C08G 77/44; C08G 77/80; C08G 2170/20; C08G 77/12; C08G 77/70; C08J 3/12; C08J 2383/04; C08J 5/18; C08J 3/203; C08J 2300/12; C08K 3/22; C08K 5/14; C08K 9/06; C08K 2003/2241; C08K 2201/001; C08K 3/013; C09J 183/04; C09J 7/10; C09J 7/35; H01L 21/56; H01L 23/29; H01L 23/31; H01L 23/296

See application file for complete search history.

(56) References Cited

U.S. PATENT DOCUMENTS

| | | |
|---|---|---|
| 5,100,976 A | 3/1992 | Hamada et al. |
| 5,145,886 A | 9/1992 | Oxman et al. |
| 5,169,727 A | 12/1992 | Boardman |
| 5,357,007 A | 10/1994 | Wengrovius et al. |
| 5,392,592 A | 2/1995 | Bozich et al. |
| 5,977,243 A | 11/1999 | Barthel et al. |
| 6,177,506 B1 | 1/2001 | Takahashi et al. |
| 6,376,569 B1 | 4/2002 | Oxman et al. |
| 6,379,792 B1 | 4/2002 | Isshiki et al. |
| 6,433,055 B1 | 8/2002 | Kleyer et al. |
| 8,124,689 B2 | 2/2012 | Loubert et al. |
| 2002/0132891 A1 | 9/2002 | Azechi et al. |
| 2004/0265599 A1 | 12/2004 | Ushio et al. |
| 2006/0057779 A1 | 3/2006 | Sutoh et al. |
| 2006/0094834 A1 | 5/2006 | Aoki et al. |

(Continued)

FOREIGN PATENT DOCUMENTS

| | | |
|---|---|---|
| AU | 618818 B2 | 1/1992 |
| CN | 101151328 A | 3/2008 |

(Continued)

OTHER PUBLICATIONS

English Translation of WO-2013051600-A1 (Year: 2013).*
English Translation of JP 2017226724 (Year: 2017).*
English Translation of JP 2003226812A (Year: 2003).*
International Search Report for PCT/JP2019/051392 dated Mar. 17, 2020, 2 pages.
Machine assisted English translation of WO2018235492A1 obtained from https://patents.google.com/patent on Oct. 4, 2021, 20 pages.
Machine assisted English translation of JP2016124967A obtained from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.

(Continued)

*Primary Examiner* — Andrew J. Oyer
*Assistant Examiner* — Cullen L G Davidson
(74) *Attorney, Agent, or Firm* — Warner Norcross + Judd LLP

(57) ABSTRACT

Provided herein is a curable granular silicone composition which has hot-melt properties, is particularly superior in flexibility and toughness at high temperatures from room temperature to about 150° C. in cured products such as overmolding, and provides a cured product that does not easily warp or become damaged even when integrally molded with an aluminum lead frame or the like. A curable granular silicone composition comprising: (A) organopolysiloxane resin microparticles having a curing reactive functional group; (B) a functional inorganic filler; and (C) a curing agent. The composition provides, upon curing, a cured material having a storage modulus at 25° C. and 150° C. of less than 2,000 MPa and less than 100 MPa, respectively, and a peak value of tan δ represented by the storage modulus/loss modulus (G'/G"), is 0.40 or more.

19 Claims, No Drawings

(56) References Cited

U.S. PATENT DOCUMENTS

| | | |
|---|---|---|
| 2006/0270788 A1 | 11/2006 | Ozai et al. |
| 2008/0319144 A1 | 12/2008 | Morita et al. |
| 2009/0042043 A1 | 2/2009 | Joseph et al. |
| 2009/0075009 A1 | 3/2009 | Fujisawa et al. |
| 2009/0171013 A1 | 7/2009 | Taguchi et al. |
| 2009/0281222 A1 | 11/2009 | Nishiumi et al. |
| 2011/0104506 A1 | 5/2011 | Behl et al. |
| 2011/0236666 A1 | 9/2011 | Hall et al. |
| 2012/0139131 A1 | 6/2012 | Sugo et al. |
| 2013/0183776 A1 | 7/2013 | Kashiwagi et al. |
| 2013/0200554 A1 | 8/2013 | Mueller |
| 2013/0274398 A1 | 10/2013 | Shiobara et al. |
| 2014/0296468 A1 | 10/2014 | Kownacka et al. |
| 2014/0377570 A1 | 12/2014 | Hirai et al. |
| 2015/0115311 A1 | 4/2015 | Yoshida et al. |
| 2015/0124338 A1 | 5/2015 | Mayumi et al. |
| 2015/0183960 A1 | 7/2015 | Yamazaki et al. |
| 2015/0315427 A1 | 11/2015 | Yoshida et al. |
| 2015/0376482 A1 | 12/2015 | Bekemeier et al. |
| 2016/0230005 A1 | 8/2016 | Mayumi et al. |
| 2016/0311980 A1 | 10/2016 | Knoer |
| 2017/0057980 A1 | 3/2017 | Boyer et al. |
| 2017/0058103 A1 | 3/2017 | Fujisawa et al. |
| 2017/0092822 A1 | 3/2017 | Amako et al. |
| 2017/0166701 A1 | 6/2017 | Jo et al. |
| 2017/0283613 A1 | 10/2017 | Mochizuki |
| 2017/0355804 A1 | 12/2017 | Fujisawa et al. |
| 2018/0105692 A1* | 4/2018 | Imaizumi ............... C08K 3/013 |
| 2018/0208816 A1 | 7/2018 | Yamazaki et al. |
| 2018/0305547 A1 | 10/2018 | Dogen et al. |
| 2019/0169398 A1 | 6/2019 | Yamazaki |
| 2019/0169435 A1 | 6/2019 | Yamazaki |
| 2019/0177488 A1 | 6/2019 | Yamazaki |
| 2019/0276684 A1 | 9/2019 | Yamazaki et al. |
| 2019/0367744 A1 | 12/2019 | Chevalier et al. |
| 2020/0216671 A1 | 7/2020 | Matsuzaki et al. |
| 2020/0224069 A1 | 7/2020 | Itoh et al. |
| 2020/0354615 A1 | 11/2020 | Itoh et al. |
| 2020/0392335 A1 | 12/2020 | Yamazaki |
| 2021/0162704 A1 | 6/2021 | Sreeram et al. |
| 2021/0179783 A1 | 6/2021 | Yoshitake |
| 2021/0179849 A1 | 6/2021 | Yoshitake |
| 2021/0189129 A1 | 6/2021 | Yamazaki et al. |
| 2021/0198489 A1 | 7/2021 | Yoshitake |
| 2021/0269691 A1 | 9/2021 | Itoh et al. |
| 2021/0284888 A1 | 9/2021 | Itoh et al. |
| 2021/0292607 A1 | 9/2021 | Itoh et al. |
| 2022/0002493 A1 | 1/2022 | Sugie et al. |
| 2022/0048230 A1 | 2/2022 | Imaizumi et al. |
| 2022/0064447 A1 | 3/2022 | Yamazaki |
| 2022/0064491 A1 | 3/2022 | Yamazaki |
| 2022/0089872 A1 | 3/2022 | Fukui et al. |
| 2022/0169894 A1 | 6/2022 | Yamazaki et al. |
| 2022/0186099 A1 | 6/2022 | Yamazaki et al. |
| 2022/0195269 A1 | 6/2022 | Yamazaki |
| 2022/0340756 A1 | 10/2022 | Nishijima et al. |
| 2022/0403114 A1 | 12/2022 | Sugie et al. |
| 2023/0044439 A1 | 2/2023 | Yamamoto et al. |
| 2023/0137947 A1 | 5/2023 | Yamazaki et al. |
| 2023/0151215 A1 | 5/2023 | Yamazaki et al. |
| 2024/0002605 A1 | 1/2024 | Tanaka et al. |
| 2024/0052106 A1 | 2/2024 | Yamazaki et al. |
| 2024/0052220 A1 | 2/2024 | Yamamoto et al. |

FOREIGN PATENT DOCUMENTS

| | | | |
|---|---|---|---|
| CN | 103849149 A | 6/2014 | |
| CN | 104870585 A | 8/2015 | |
| CN | 106459419 A | 2/2017 | |
| CN | 106715593 A | 5/2017 | |
| CN | 107429062 A | 12/2017 | |
| CN | 108026373 A | 5/2018 | |
| CN | 109844029 A | 6/2019 | |
| EP | 1002834 A1 | 5/2000 | |
| EP | 3954739 A1 | 2/2022 | |
| EP | 4083140 A1 | 11/2022 | |
| EP | 4130157 A1 | 2/2023 | |
| EP | 4269503 A1 | 11/2023 | |
| JP | H0275681 A | 3/1990 | |
| JP | H0625602 A | 2/1994 | |
| JP | H11158379 A | 6/1999 | |
| JP | H11279182 A | 10/1999 | |
| JP | H11335572 A | 12/1999 | |
| JP | 2000063681 A | 2/2000 | |
| JP | 2000198929 A | 7/2000 | |
| JP | 2001019933 A | 1/2001 | |
| JP | 2002155261 A | 5/2002 | |
| JP | 2003176462 A | 6/2003 | |
| JP | 2003226812 * | 8/2003 | |
| JP | 2003226812 A | 8/2003 | |
| JP | 2004043814 A | 2/2004 | |
| JP | 2004307691 A | 11/2004 | |
| JP | 2004315571 A | 11/2004 | |
| JP | 2005007331 A | 1/2005 | |
| JP | 2006188593 A | 7/2006 | |
| JP | 2006274007 A | 10/2006 | |
| JP | 2007119768 A | 5/2007 | |
| JP | 2007231039 A | 9/2007 | |
| JP | 2009503133 A | 1/2009 | |
| JP | 2009132797 A | 6/2009 | |
| JP | 2009155415 A | 7/2009 | |
| JP | 2010047646 A | 3/2010 | |
| JP | 2010047676 A | 3/2010 | |
| JP | 2010509088 A | 3/2010 | |
| JP | 2011525444 A | 9/2011 | |
| JP | 2012017427 A | 1/2012 | |
| JP | 2013076050 A | 4/2013 | |
| JP | 2013523482 A | 6/2013 | |
| JP | 2013147546 A | 8/2013 | |
| JP | 2013221075 A | 10/2013 | |
| JP | 2013221082 A | 10/2013 | |
| JP | 2013222761 A | 10/2013 | |
| JP | 2013232580 A | 11/2013 | |
| JP | 5385247 B2 | 1/2014 | |
| JP | 2014009322 A | 1/2014 | |
| JP | 2015010132 A | 1/2015 | |
| JP | 2015110752 A | 6/2015 | |
| JP | 2015214637 A | 12/2015 | |
| JP | 2016124967 A | 7/2016 | |
| JP | 2017512224 A | 5/2017 | |
| JP | 2017101137 A | 6/2017 | |
| JP | 2017520918 A | 7/2017 | |
| JP | 2017226724 * | 12/2017 | |
| JP | 2017226724 A | 12/2017 | |
| JP | 2018519369 A | 7/2018 | |
| JP | 2018177993 A | 11/2018 | |
| JP | 2019167832 A | 10/2019 | |
| JP | 2019167833 A | 10/2019 | |
| JP | 2021107149 A | 7/2021 | |
| JP | 2021108319 A | 7/2021 | |
| TW | 201439219 A | 10/2014 | |
| WO | 2006104236 A1 | 10/2006 | |
| WO | 2008056810 A1 | 5/2008 | |
| WO | WO-2013051600 A1 * | 4/2013 | ....... B29C 45/14655 |
| WO | 2014002918 A1 | 1/2014 | |
| WO | 2014136805 A1 | 9/2014 | |
| WO | 2015056483 A1 | 4/2015 | |
| WO | 2015126780 A1 | 8/2015 | |
| WO | 2015155949 A1 | 10/2015 | |
| WO | 2016038836 A1 | 3/2016 | |
| WO | 2016103654 A1 | 6/2016 | |
| WO | WO-2016136243 A1 * | 9/2016 | ............. C08G 77/08 |
| WO | 2017068762 A1 | 4/2017 | |
| WO | 2018028792 A1 | 2/2018 | |
| WO | 2018030286 A1 | 2/2018 | |
| WO | 2018030287 A1 | 2/2018 | |
| WO | 2018030288 A1 | 2/2018 | |
| WO | 2018084012 A1 | 5/2018 | |
| WO | 2018186161 A1 | 10/2018 | |
| WO | 2018235491 A1 | 12/2018 | |
| WO | 2018235492 A1 | 12/2018 | |
| WO | 2019059351 A1 | 3/2019 | |
| WO | 2019078140 A1 | 4/2019 | |
| WO | 2019088067 A1 | 5/2019 | |

(56) References Cited

FOREIGN PATENT DOCUMENTS

| WO | 2019208756 A1 | 10/2019 |
|---|---|---|
| WO | 2020090797 A | 5/2020 |
| WO | 2020138055 A1 | 7/2020 |
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2007231039A obtained from https://patents.google.com/patent on Oct. 5, 2021, 7 pages.
Machine assisted English translation of CN103849149A obtained from https://worldwide.espacenet.com/patent on Jan. 22, 2024, 11 pages.
Machine assisted English translation of JPH11158379A obtained from https://worldwide.espacenet.com/patent on Nov. 9, 2023, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
International Search Report for PCT/JP2019/051393 dated Mar. 17, 2020, 3 pages.
International Search Report for PCT/JP2019/051391 dated Mar. 13, 2020, 3 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
English translation of International Search Report for PCT/JP2019/042320 dated Mar. 24, 2020, 2 pages.
Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsiltm EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.

\* cited by examiner

CURABLE SILICONE COMPOSITION, CURED PRODUCT THEREOF, AND METHOD FOR PRODUCING SAME

CROSS-REFERENCE TO RELATED APPLICATIONS

This application is the National Stage of International Appl. No. PCT/JP2019/051392 filed on 27 Dec. 2019, which claims priority to and all advantages of Japanese Patent Application No. 2018-245659 filed on 27 Dec. 2018, the content of which is hereby incorporated by reference.

TECHNICAL FIELD

The present invention relates to a curable granular silicone composition which can be obtained by a simple manufacturing method and which has excellent hot-melt properties and suppression of warpage of the cured product relative to a lead frame or the like. Further, the present invention relates to a cured product using the curable granular silicone composition, pellet, or sheet, a molding method for the cured product, and a semiconductor device provided with the cured product.

BACKGROUND ART

Curable silicone compositions are utilized in a wide range of industrial fields because they are cured to form cured products having excellent heat resistance, cold resistance, electrical insulation, weather resistance, water repellency, and transparency. In general, the cured product of such a curable silicone composition is also suitable as an encapsulant for optical materials and semiconductor devices because it is not readily discolored as compared with other organic materials, and there is less deterioration of physical properties.

The present applicant has proposed, in Patent Document 1 and Patent Document 2, a so-called hot melt curable granular silicone composition and a reactive silicone composition for molding. These silicone compositions are made up of so-called phenyl silicone resins, which have the advantages of superior hot-melt properties and superior hardness and strength of the cured product when compared to methyl silicone resins.

In addition, in Patent Document 3 and Patent Document 4, the present applicant has proposed a liquid (paste) curable silicone composition. However, these curable silicone compositions in liquid or paste form do not have sufficient workability, curing characteristics, or gap-filling properties, and the flexibility and toughness of the cured product at temperatures from room temperature to about 150° C. are insufficient. In particular, the lack of flexibility of the cured product may cause warpage and breakage problems.

On the other hand, Patent Document 5 and Patent Document 6 disclose a hot-melt curable composition using a mixed filler containing coarse particles. However, the storage elastic modulus of the cured product at room temperature is extremely high (for example, more than 5,000 MPa in Patent Document 5), and the material is not flexible and is difficult to apply to applications that are subject to deformation and bending at room temperature.

In order to resolve these problems, the present applicant has proposed, in Patent Document 7, a curable granular silicone composition containing an inorganic filler substantially free of coarse particles having an average particle diameter of 10.0 µm or more. The composition has improved flexibility and toughness of the cured product at high temperatures from room temperature to roughly 150° C., and can suppress warpage and breakage of the cured product to some extent.

However, in recent years, with the development of the semiconductor device industry, there has been a strong demand for a larger molding area and a thinner molding thickness. Even with the curable granular silicone composition described above, warpage or breakage of the cured product may occur under conditions such as molding methods involving thin-film molding of a large area, especially integrated molding with a thin substrate that is prone to warpage. In addition, there is a need for cured silicone compositions with excellent gap-filling properties while melted, and further improved flexibility and toughness at temperatures from room temperature to about 150° C. Furthermore, in the existing curable silicone compositions, when a relatively large amount of functional filler is blended, especially during thin molding, the stress relief properties of the cured product described above decreases and warpage and breakage tend to occur, and the problem of the trade-off between the content of the functional filler and the stress relief properties of the cured product cannot be resolved.

PATENT DOCUMENTS

Patent Document 1: International Unexamined Patent Application 2016/136243
Patent Document 2: Japanese Unexamined Patent Application 2014-009322
Patent Document 3: International Unexamined Patent Application 2016/038836
Patent Document 4: Japanese Unexamined Patent Application 2013-076050
Patent Document 5: Japanese Unexamined Patent Application 2013-221075
Patent Document 6: International Unexamined Patent Application 2013/051600 Pamphlet
Patent Document 7: International Unexamined Patent Application 2018/030287 Pamphlet

SUMMARY OF THE INVENTION

Problems to be Solved by the Invention

An object of the present invention is to provide a curable granular silicone composition having hot-melt properties, superior workability and curing characteristics, superior gap-filling properties while melted, and capable of forming a flexible cured product having superior stress relief even when containing a large amount of functional inorganic filler of small particle diameter. An additional object of the present invention is to provide a method for efficiently manufacturing such a curable silicone composition.

Furthermore, the present invention provides a semiconductor device member composed of such a curable silicone composition, pellets, and sheets and the like cured product, a semiconductor device having the cured product, and a molding method of the cured product.

Means for Solving the Problems

As a result of intensive investigation, the inventors have found that a curable granular silicone composition containing:

(A) an organopolysiloxane resin microparticles having a curing reactive functional group;
(B) a functional inorganic filler; and
(C) a curing agent, and
is characterized by being a curable product hardened such that the value of the storage elastic modulus (G') at 25° C. is 2,000 MPa or less,
the value of the storage elastic modulus (G') at 150° C. is 100 MPa or less,
the peak value of the loss tangent (tan δ) of the cured product, which is expressed by the storage elastic modulus/loss elastic modulus at a frequency of 1.0 Hz, is 0.40 or more, and,
can solve the problems as described above, arriving at the present invention.

Note that the curable silicone composition as described above may be in the form of pellets or sheets.

Component (B) is preferably a functionally inorganic filler that is one or more types selected from a reinforcing filler, a white pigment, a thermal conductive filler, an electrically conductive filler, or an organic filler.

At least some or all of component (A) as described above can be:
(A1) hot-meltable organopolysiloxane resin microparticles having a softening point of 30° C. or higher and having a curing reactive functional group containing at least one carbon-carbon double bond in the molecule.

In addition, at least some or all of component (A) as described above can be a mixture of:
(A2-1) an organopolysiloxane resin microparticle made up of a siloxane unit represented by $SiO_{4/2}$ making up at least 20 mol % or more of the total siloxane units having a curing reactive functional group containing at least 1 carbon-carbon double bond in the molecule and no hot-melt properties as a whole molecule, or
(A2-2) a straight or branched chain organopolysiloxane, liquid at 25° C., having a curing reactive functional group containing at least two carbon-carbon double bonds in the molecule.

Furthermore, in addition to component (A2-1) as described above:
(A2-1-2) an organopolysiloxane resin microparticle made up of a siloxane unit represented by $SiO_{4/2}$ making up at least 20 mol % or more of the total siloxane units having a curing reactive functional group containing at least 1 carbon-carbon double bond in the molecule and no hot-melt properties as a whole molecule.

In addition, component (B) is preferably a filler which does not have a softening point or which does not soften below the softening point of component (A), and preferably does not substantially contain coarse particles with an average particle diameter of 5.0 μm or more. Further, from the viewpoint of the functionality and physical properties of the cured product, component (B) is preferably a reinforcing filler, a white pigment, a thermally conductive filler, an electrically conductive filler, a phosphor, or a mixture of at least two of these. In particular, from the viewpoint of flexibility and high gap-filling at room temperature to high temperature, it preferably contains (b1) inorganic filler having an average particle diameter of 0.1 μm or less and (b2) inorganic filer having an average particle diameter of 0.1 to 5.0 μm in a mass ratio of 1/99 to 50/50.

The content of component (B) is preferably in the range of 10 to 50% by volume with respect to the entire composition.

The curable granular silicone composition of the present invention is preferably in the form of pellets or sheets.

In particular, when the curable granular silicone composition of the present invention is in sheet form, a laminate body can be formed having a structure including a sheet-like member made up of the curable granular silicone composition described above between two film-like substrates provided with a release layer. The sheet-like member preferably has a thickness of 1 mm or less and is a film-like adhesive, which can be handled as a peelable laminate.

The curable granular silicone composition of the present invention can be used in the form of a cured product and can be used as a member for a semiconductor device.

The curable granular silicone composition of the present invention and the cured product thereof can be used in semiconductor devices, which can provide a power semiconductor device, an optical semiconductor device, and a semiconductor device mounted on a flexible circuit base, in which an encapsulant, a light reflecting material, and the like are formed by said cured product. In particular, the curable granular silicone composition of the present invention has superior gap-filling properties when melted, and the cured product thereof has superior flexibility and toughness at room temperature to high temperature. Therefore, the cured product is suitable for semiconductor devices in which semiconductor elements are encapsulated in a single package by so-called mold underfill or wafer molding, and for post-encapsulation semiconductor element substrates in which semiconductor elements are encapsulated by the cured product on a flexible circuit board that is subject to deformation (bending, and the like).

The method of molding the curable granular silicone composition of the present invention includes at least the following steps:
(I) A step of heating the curable granular silicone composition in the form of pellets or sheets to a temperature of 100° C. or higher to melt;
(II) A step of injecting the curable silicone composition obtained in step (I) into a mold or a step of distributing the curable silicone composition obtained in step (I) to a mold by clamping; and
(III) a step of curing the curable silicone composition injected in step (II).

Note that the molding method described above includes transfer molding, compression molding, or injection molding, and the curable granular silicone composition of the present invention is suitably used as a material for the molding thereof. Furthermore, the curable granular silicone composition of the present invention is suitable for the so-called mold underfill method, which is a coating process in which overmolding and underfilling of a semiconductor device are performed at the same time by the cured product, and the surface of a semiconductor wafer substrate on which a semiconductor device is mounted is covered and the gap between the semiconductor device is filled. Moreover, an overmolding process of filling the gaps of the semiconductor element can be used and can be suitably used as a material for molding of the wafer molding method, in which a relatively large wafer such as 8 inches or 12 inches may be sealed all at once.

In particular, the curable granular silicone compositions of the present invention, especially the curable granular silicone compositions which are in pellet or sheet form, can be used for large-area encapsulation of semiconductor substrates (including wafers). Furthermore, a sheet formed from the curable granular silicone composition of the present invention can be used for die attach films, sealing flexible devices, stress relief layers for bonding two different substrates, and the like.

Effects of the Invention

The curable granular silicone composition of the present invention having hot melt properties, superior workability and curing characteristics, superior gap-filling properties when melted, and can form flexible cured products with superior stress relief even when containing large amounts of functional inorganic fillers of small particle diameter. Furthermore, the curable granular silicone composition of the present invention can be given a low linear expansion coefficient, thermal conductivity, or light reflectivity to the cured product by changing the type of the functional inorganic filler in question. In addition, this manner of curable silicone composition can be produced using only simple mixing processes and can be efficiently manufactured. In addition, the cured product of the present invention is useful as a member of a semiconductor device, and by using the molding method of the present invention, these cured products can be efficiently produced in accordance with applications.

MODE FOR CARRYING OUT THE INVENTION

[Curable Particulate Silicone Composition]
The curable granular silicone composition of the present invention comprising:
 (A) organopolysiloxane resin microparticles having a curing reactive functional group;
 (B) a functional inorganic filler; and
 (C) a curing agent, and
 is characterized by being a curable product hardened such that the value of the storage elastic modulus (G') at 25° C. is 2,000 MPa or less, the value of the storage elastic modulus (G') at 150° C. is 100 MPa or less, and
 the peak value of tan δ of the cured product, which is expressed by the storage elastic modulus/loss elastic modulus (G'/G") at a frequency of 1.0 Hz, is 0.40 or more.
 In the present invention, unless otherwise stated, "having hot melt properties" means having a softening point of 50° C. or higher, having a melt viscosity at 150° C. (suitably, a melt viscosity of less than 1,000 Pa-s), and having flowing properties. On the other hand, if the softening point is 200° C. or higher, it is defined as "does not have hot melt properties" because it is above the general operating temperature for molding applications.

Hereinafter, each component and optional component of the composition will be described. In the present invention, the term "average particle diameter" means the primary average particle diameter of the particles unless otherwise defined. Functional inorganic fillers with an average particle diameter of 10.0 μm or more may be described as "coarse particles".

Component (A) is organopolysiloxane resin microparticles having a curing reactive functional group, which is a base compound of this composition and is cured by the (C) curing agent. Here, the curing reactive functional group is one or more functional groups selected from a condensation reactive group, a hydrosilylation reactive group, a radical reactive group, and a peroxide curable group. However, a hydrosilylation reactive group or a radical reactive group are preferred, and in particular, a curing reactive functional group containing a carbon-carbon double bond is preferred.

Examples of the hydrosilylation reactive group in component (A) include an alkenyl group having 2 to 20 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, and a silicon atom bonded hydrogen atom. As the hydrosilylation reactive group, an alkenyl group is preferable. The alkenyl group may be linear or branched, and is preferably a vinyl group or a hexenyl group. Component (A) preferably has at least two hydrosilylation reactive groups in one molecule.

Examples of the group bonded to a silicon atom other than the hydrosilylation reactive group in component (A) include an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group. Specific examples thereof include alkyl groups such as methyl, ethyl, propyl, butyl, pentyl, hexyl, heptyl, octyl, nonyl, decyl, undecyl, and dodecyl; aryl groups such as phenyl, tolyl, xylyl, naphthyl, anthracenyl, phenanthryl, and pyrenyl; aralkyl groups such as phenethyl and phenylpropyl; groups in which a part or all of the hydrogen atoms bonded to these groups are substituted with a halogen atom such as a chlorine atom and a bromine atom; and alkoxy groups such as methoxy, ethoxy, and propoxy. In particular, a phenyl group and a hydroxyl group are preferable.

Examples of radical reactive groups in component (A) include alkyl groups having 1 to 20 carbon atoms, such as methyl, ethyl, propyl, butyl, pentyl, hexyl, heptyl, octyl, nonyl, decyl, undecyl, and dodecyl; alkenyl groups having 2 to 20 carbon atoms, such as vinyl, allyl, butenyl, pentenyl, hexenyl, heptenyl, octenyl, nonenyl, decenyl, undecenyl, and dodecenyl; acryl-containing groups such as 3-acryloxypropyl and 4-acryloxybutyl; methacryl-containing groups such as 3-methacryloxypropyl and 4-methacryloxybutyl; and a silicon atom bonded hydrogen atom. As the radical reactive group, an alkenyl group is preferable. The alkenyl group may be linear or branched, and is preferably a vinyl group or a hexenyl group. Component (A) preferably has at least two radical reactive groups in one molecule.

Examples of the group bonded to a silicon atom other than the radical reactive group in component (A) include a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group, and the same groups as those described above are exemplified. In particular, a phenyl group and a hydroxyl group are preferable. In particular, in component (A), it is preferable that 10 mol % or more of the total organic groups in the molecule be an aryl group, in particular, a phenyl group.

In the present invention, component (A) includes organopolysiloxane resin microparticles having a curing reactive functional group, but said organopolysiloxane resin microparticles may be hot-meltable as a whole molecule, or may include organopolysiloxane resin microparticles that are not hot-meltable as a whole molecule. If the organopolysiloxane resin microparticles in question do not have hot-melt properties, they are preferably a mixture of straight or branched chain organopolysiloxane. Furthermore, organopolysiloxane resin microparticles which do not have a curing reactive functional group and do not have hot melt properties as a whole molecule may be used in combination and are preferred.

In other words, at least some or all of component (A) can be
- (A1) a hot-meltable organopolysiloxane resin microparticle having a softening point of 30° C. or more and having a curing reactive functional group containing at least one carbon-carbon double bond in the molecule, and can also be a mixture of
- (A2-1) an organopolysiloxane resin microparticle made up of a siloxane unit represented by $SiO_{4/2}$ making up at least 20 mol % or more of the total siloxane units having a curing reactive functional group containing at least 1 carbon-carbon double bond in the molecule and no hot-melt properties as a whole molecule, or
- (A2-2) a straight or branched chain organopolysiloxane, liquid at 25° C., and having a curing reactive functional group containing at least two carbon-carbon double bonds in the molecule.

These components are described hereinafter.

[Component (A1)]

Component (A1) has hot-melt properties by itself and has a curing reactive functional group containing at least one carbon-carbon double bond in the molecule, such that it is cured by the (C) curing agent described below. Such a component (A1) is preferably organopolysiloxane resin microparticles that is: ($A_1$) a resinous organopolysiloxane; ($A_2$) an organopolysiloxane crosslinked product obtained by crosslinking at least one type of organopolysiloxane; ($A_3$) a block copolymer composed of a resinous organosiloxane block and a chained organosiloxane block; or a mixture of at least 2 of these.

Component (A1) is a resinous organopolysiloxane having a hydrosilylation reactive group and/or a radical reactive group, and is preferably a hot-melt resinous organopolysiloxane having a large number of T-units or Q-units and an aryl group. Examples of such a component (A1) include MQ resins, MDQ resins, MTQ resins, MDTQ resins, TD resins, TQ resins, and TDQ resins consisting of any combination of: a triorganosiloxane unit (M unit) (the organo group is a methyl group only, a methyl group and a vinyl group, or a phenyl group); a diorganosiloxane unit (D unit) (the organo group is a methyl group only, a methyl group and a vinyl group, or a phenyl group); a monoorganosiloxane unit (T unit) (the organo group is a methyl group, a vinyl group, or a phenyl group); and a siloxy unit (Q unit). It is preferable that component (A1) has at least two hydrosilylation reactive groups and/or radical reactive groups in the molecule, and 10 mol % or more of the total organic groups in the molecule is an aryl group, particularly, a phenyl group.

Since component (A2) is formed by crosslinking at least one organopolysiloxane, cracks are not readily generated when the component is cured by the curing agent (C), and the curing shrinkage can be reduced. Here, "crosslinking" means linking the organopolysiloxane as a raw material by a hydrosilylation reaction, a condensation reaction, a radical reaction, a high energy ray reaction, or the like. Examples of the hydrosilylation reactive group and the radical reactive group (including the high energy ray reactive group) include the same groups as those described above, and examples of the condensation reactive group include a hydroxyl group, an alkoxy group, and an acyloxy group.

The unit constituting component (A2) is not limited, and siloxane units and siloxane units containing silalkylene groups are exemplified, and it is preferable to have a resinous polysiloxane unit and a chained polysiloxane unit in the same molecule because they impart adequate hardness and mechanical strength to the obtained cured product. That is, component (A2) is preferably a crosslinked product of a resinous organopolysiloxane and a chained organopolysiloxane (including a linear or branched chain organopolysiloxane). By introducing the resinous organopolysiloxane structure-chained organopolysiloxane structure into component (A2), component (A2) exhibits good hot-melt properties, and the curing agent (C) exhibits good curing properties.

Component (A2) is any one of the following (1) to (3):
(1) One obtained by linking a resinous organopolysiloxane structure-chain organopolysiloxane structure in the molecule by an alkylene linkage via a hydrosilylation reaction of an organopolysiloxane having at least two alkenyl groups in one molecule and an organopolysiloxane having at least two silicon atom bonded hydrogen atoms in one molecule;
(2) One obtained by linking a resinous organopolysiloxane structure-chain organopolysiloxane structure in the molecule by a siloxane linkage or an alkylene linkage via a radical reaction of an organic peroxide of at least two organopolysiloxanes having at least two radical reactive groups in one molecule;
(3) One obtained by linking a resinous organopolysiloxane structure-chain organopolysiloxane structure in the molecule by a siloxane (—Si—O—Si—) linkage via a condensation reaction of at least two organopolysiloxanes.

Such component (A2) has a structure in which organopolysiloxane moieties of the resin structure-chain structure are linked by an alkylene group or new siloxane linkage, so that hot-melt properties are remarkably improved.

In the above (1) and (2), as the alkylene group contained in component (A2), an alkenyl group having 2 to 20 carbon atoms such as an ethylene group, a propylene group, a butylene group, a pentylene group, a hexylene group, or the like is exemplified, and these groups may be linear or branched, and are preferably an ethylene group or a hexylene group.

The crosslinked products of resinous organopolysiloxanes and chain organopolysiloxanes, including linear or branched chain organopolysiloxanes, are composed of, for example, the following siloxane units and siloxane units containing silalkylene groups:

M-units: siloxane units represented by $R^1R^2{}_2SiO_{1/2}$;
D-units: siloxane units represented by $R^1R^2SiO_{2/2}$;
$R^3M/R^3D$-units: at least one siloxane unit selected from a silalkylene group containing siloxane unit represented by $R^3{}_{1/2}R^2{}_{2/2}SiO_{1/2}$ and a silalkylene group containing siloxane unit represented by $R^3{}_{1/2}R^2SiO_{2/2}$; and
T/Q-units: at least one siloxane unit selected from a siloxane unit represented by $R^2SiO_{3/2}$ and a siloxane unit represented by $SiO_{4/2}$.

In the formula, each $R^1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. $R^1$ is preferably a methyl group, a vinyl group, or a phenyl group. However, it is preferable that at least two $R^1$ of all siloxane units are alkenyl groups.

In addition, in the formula, each $R^2$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified. $R^2$ is preferably a methyl group or a phenyl group.

In the formulae, $R^3$ is a linear or branched alkylene group having 2 to 20 carbon atoms bonded to a silicon atom in other siloxane units. As the alkylene group, the same groups as described above are exemplified, and an ethylene group and a hexylene group are preferable.

The M-unit is a siloxane unit constituting the terminal of component (A2), and the D-unit is a siloxane unit constituting a linear polysiloxane structure. Note that it is preferable that an alkenyl group is present on the M-unit or the D-unit, in particular, the M-unit. On the other hand, the $R^3$M-unit and the $R^3$D-unit are siloxane units bonded to a silicon atom in another siloxane unit via a silalkylene linkage and bonded to a silicon atom in another siloxane unit via an oxygen atom. The T/Q-unit is a branched siloxane unit which gives a resinous structure to the polysiloxane, and component (A2) preferably contains a siloxane unit represented by $R^2SiO_{3/2}$ and/or a siloxane unit represented by $SiO_{4/2}$. In particular, since the hot-melt properties of component (A2) are improved and the content of the aryl group in component (A2) is adjusted, it is preferable that component (A2) contains a siloxane unit represented by $R^2SiO_{3/2}$, and in particular, it is preferable that component (A2) contains a siloxane unit in which $R^2$ is a phenyl group.

The $R^3$M/$R^3$D-unit is one of the characteristic structures of component (A2), and represents a structure in which silicon atoms are crosslinked via the alkylene group of $R^3$. Specifically, the $R^3$M/$R^3$D-unit is at least one siloxane unit selected from an alkylene group-containing siloxane unit represented by $R^3_{1/2}R^2_2SiO_{1/2}$ and an alkylene group-containing siloxane unit represented by $R^3_{1/2}R^2SiO_{2/2}$, and at least two of all siloxane units constituting component (A2) are preferably these alkylene group-containing siloxane units. The preferred form of linkage between siloxane units having alkylene groups of $R^3$ is as described above, and the number of $R^3$ between two alkylene group-containing siloxane units is expressed as the linkage number "½" as is the number of oxygens and the like in the M-units. Assuming that the number of $R^3$ is 1, at least one selected from the structural units of siloxanes represented by $[O_{1/2}R^2_2SiR^3SiR^2_2O_{1/2}]$, $[O_{1/2}R^2_2SiR^3SiR^2O_{2/2}]$, and $[O_{2/2}R^2SiR^3SiR^2O_{2/2}]$ is contained in component (A2), and each oxygen atom (O) is bonded to a silicon atom contained in the M, D, and T/Q-units. With such a structure, component (A2) can relatively easily design a structure having a chain polysiloxane structure comprised of D-units and a resinous polysiloxane structure containing T/Q-units in the molecule, and the component is remarkably excellent in physical properties.

In the above (1), the component can be obtained by hydrosilylation reaction of an organopolysiloxane having at least two alkenyl groups in one molecule and an organopolysiloxane having at least two silicon atom bonded hydrogen atoms in one molecule at a reaction ratio of [number of moles of alkenyl groups]/[number of moles of silicon atom bonded hydrogen atoms]>1.

In the above (2), the component can be obtained by radical reaction of at least two organopolysiloxanes having at least two radical reactive groups in one molecule with an organic peroxide in an amount which is insufficient for all radical reactive groups in the system to react.

In the above (1) and (2), component (A2) is obtained by subjecting an organopolysiloxane having a resinous siloxane structure and an organopolysiloxane having a chain siloxane structure to a hydrosilylation reaction or a radical reaction.

For example, component (A2) is an organopolysiloxane obtained by reacting:
($A^R$) at least one type of resinous organopolysiloxane containing a siloxane unit represented by $R^2SiO_{3/2}$ (where $R^2$ is the same group as described above) and/or a siloxane unit represented by $SiO_{4/2}$ in the molecule and having an alkenyl group with 2 to 20 carbon atoms or a silicon-bonded hydrogen atom or a radical reactive group; and ($A^L$) at least one type of chained organopolysiloxane ($A^L$) containing a siloxane unit represented by $R^2_2SiO_{2/2}$ (where $R^2$ is the same group as described above) in the molecule and having a group capable of a hydrosilylation reaction or a radical reaction with the component ($A^R$), the group being an alkenyl group with 2 to 20 carbon atoms or a silicon-bonded hydrogen atom;

at a ratio designed so that the hydrosilylation reactive group and/or radical reactive group in component ($A^R$) or component ($A^L$) remains after the reaction.

In the above (1), when at least a part of component ($A^R$) is a resinous organopolysiloxane having an alkenyl group of 2 to 20 carbon atoms, it is preferable that at least a part of component ($A^L$) is a chain organopolysiloxane having a silicon atom bonded hydrogen atom.

Similarly, when at least a part of component ($A^R$) is a resinous organopolysiloxane having a silicon atom bonded hydrogen atom, it is preferable that at least a part of component ($A^L$) is a chain organopolysiloxane having an alkenyl group of 2 to 20 carbon atoms.

Such a component (A2) is preferably:
component ($a_1$): a substance obtained by performing a radical reaction on an organopolysiloxane having at least two alkenyl groups with 2 to 20 carbon atoms in the molecule containing the component ($a_{1-1}$) below and/or the component ($a_{1-2}$) below, with an organic peroxide; or
a substance obtained by performing a hydrosilylation reaction on component ($a_1$) and ($a_2$) an organohydrogenpolysiloxane
in the presence of a hydrosilylation reaction catalyst in an amount such that the molar ratio of the silicon-bonded hydrogen atoms in the component ($a_2$) is from 0.2 to 0.7 mol with respect to the alkenyl groups having 2 to 20 carbon atoms included in the component ($a_1$).

Component ($a_{1-1}$) is polysiloxanes with relatively large amounts of branching units, and organopolysiloxanes having at least two alkenyl groups in one molecule, expressed by the average unit formula:

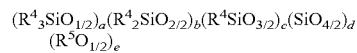

$(R^4_3SiO_{1/2})_a(R^4_2SiO_{2/2})_b(R^4SiO_{3/2})_c(SiO_{4/2})_d$
$(R^5O_{1/2})_e$

In the formula, each $R^4$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified. Preferably, $R^4$ is a methyl group, a vinyl group, or a phenyl group. Note that at least two of $R^4$ are alkenyl groups. In addition, since the hot-melt properties are good, it is preferable that 10 mol % or more, or 20 mol % or more of the total $R^4$ is a phenyl group. Furthermore, in the formula, $R^5$ is a hydrogen atom or an alkyl group having 1 to 6 carbon atoms, and the same alkyl groups as those described above are exemplified.

In the formula, a is a number within the range of 0 to 0.7, b is a number within the range of 0 to 0.7, c is a number within the range of 0 to 0.9, d is a number within the range of 0 to 0.7, e is a number within the range of 0 to 0.1, c+d is a number within the range of 0.3 to 0.9, and a+b+c+d is 1, preferably a is a number within the range of 0 to 0.6, b is a number within the range of 0 to 0.6, c is a number within the range of 0 to 0.9, d is a number within the range of 0 to 0.5, e is a number within the range of 0 to 0.05, c+d is a number within the range of 0.4 to 0.9, and a+b+c+d is 1. This is because the hardness and mechanical strength of the obtained cured product are excellent when a, b, and c+d are each a number within the above range.

The following organopolysiloxanes are examples of such a component ($a_{1-1}$). In the formula, Me, Ph, and Vi represent a methyl group, a phenyl group, and a vinyl group, respectively.

$(ViMe_2SiO_{1/2})_{0.25}(PhSiO_{3/2})_{0.75}(HO_{1/2})_{0.02}$ $(ViMe_2SiO_{1/2})_{0.25}(PhSiO_{3/2})_{0.75}$ $(ViMe_2SiO_{1/2})_{0.20}(PhSiO_{3/2})_{0.80}$ $(ViMe_2SiO_{1/2})_{0.15}(Me_3SiO_{1/2})_{0.38}(SiO_{4/2})_{0.47}(HO_{1/2})_{0.01}$ $(ViMe_2SiO_{1/2})_{0.13}(Me_3SiO_{1/2})_{0.45}(SO_{4/2})_{0.42}(HO_{1/2})_{0.01}$ $(ViMe_2SiO_{1/2})_{0.15}(PhSO_{3/2})_{0.85}(HO_{1/2})_{0.01}$ $(Me_2SiO_{2/2})_{0.15}(MeViSiO_{2/2})_{0.10}(PhSO_{3/2})_{0.75}(HO_{1/2})_{0.04}$ $(MeViPhSiO_{1/2})_{0.20}(PhSiO_{3/2})_{0.80}(HO_{1/2})_{0.05}$ $(ViMe_2SiO_{1/2})_{0.15}(PhSO_{3/2})_{0.75}(SO_{4/2})_{0.10}(HO_{1/2})_{0.02}$ $(Ph_2SiO_{2/2})_{0.25}(MeViSiO_{2/2})_{0.30}(PhSO_{3/2})_{0.45}(HO_{1/2})_{0.04}$ $(Me_3SiO_{1/2})_{0.20}(ViMePhSiO_{1/2})_{0.40}(SO_{4/2})_{0.40}(HO_{1/2})_{0.08}$

Component ($a_{1-2}$) is polysiloxanes with relatively large amounts of chain siloxane units, and organopolysiloxanes having at least two alkenyl groups in one molecule, expressed by the average unit formula:

$$(R^4{}_3SiO_{1/2})_{a'}(R^4{}_2SiO_{2/2})_{b'}(R^4SiO_{3/2})_{c'}(SiO_{4/2})_{d'}(R^5O_{1/2})_{e'}$$

In the formula, $R^4$ and $R^5$ are the same groups as described above.

In the formula, a' is a number within the range of 0.01 to 0.3, b' is a number within the range of 0.4 to 0.99, c' is a number within the range of 0 to 0.2, d' is a number within the range of 0 to 0.2, e' is a number within the range of 0 to 0.1, c'+d' is a number within the range of 0 to 0.2, and a'+b'+c'+d' is 1; preferably a' is a number within the range of 0.02 to 0.20, b' is a number within the range of 0.6 to 0.99, c' is a number within the range of 0 to 0.1, d' is a number within the range of 0 to 0.1, j' is a number within the range of 0 to 0.05, c'+d' is a number within the range of 0 to 0.1, and a'+b'+c'+d' is 1. This is because if a', b', c', and d' are each a number within the above range, the obtained cured product can be imparted with toughness.

As such a component ($a_{1-2}$), the following organopolysiloxanes are exemplified. In the formula, Me, Ph, and Vi represent a methyl group, a phenyl group, and a vinyl group, respectively.

$ViMe_2SiO(MePhSiO)_{18}SiMe_2Vi$, i.e., $(ViMe_2SiO_{1/2})_{0.10}(MePhSiO_{2/2})_{0.90}$ $ViMe_2SiO(MePhSiO)_{30}SiMe_2Vi$, in other words, $(ViMe_2SiO_{1/2})_{0.063}(MePhSiO_{2/2})_{0.937}$ $ViMe_2SiO(MePhSiO)_{150}SiMe_2Vi$, in other words, $(ViMe_2SiO_{1/2})_{0.013}(MePhSiO_{2/2})_{0.987}$ $ViMe_2SiO(Me_2SiO)_{18}SiMe_2Vi$, i.e., $(ViMe_2SiO_{1/2})_{0.10}(Me_2SiO_{2/2})_{0.90}$ $ViMe_2SiO(Me_2SiO)_{30}SiMe_2Vi$, in other words, $(ViMe_2SiO_{1/2})_{0.063}(Me_2SiO_{2/2})_{0.937}$ $ViMe_2SiO(Me_2SiO)_{35}(MePhSiO)_{13}SiMe_2Vi$, i.e., $(ViMe_2SiO_{1/2})_{0.04}(Me_2SiO_{2/2})_{0.70}(MePhSiO_{2/2})_{0.26}$ $ViMe_2SiO(Me_2SiO)_{10}SiMe_2Vi$, in other words, $(ViMe_2SiO_{1/2})_{0.17}(Me_2SiO_{2/2})_{0.83}$ $(ViMe_2SiO_{1/2})_{0.10}(MePhSiO_{2/2})_{0.80}(PhSiO_{3/2})_{0.10}(HO_{1/2})_{0.02}$ $(ViMe_2SiO_{1/2})_{0.20}(MePhSiO_{2/2})_{0.70}(SiO_{4/2})_{0.10}(HO_{1/2})_{0.01}$ $HOMe_2SiO(MeViSiO)_{20}SiMe_2OH$ $Me_2ViSiO(MePhSiO)_{30}SiMe_2Vi$ $Me_2ViSiO(Me_2SiO)_{150}SiMe_2Vi$ Component ($a_{1-1}$) is preferably used from the viewpoint of imparting hardness and mechanical strength to the obtained cured product. Component ($a_{1-2}$) can be added as an optional component from the viewpoint of imparting toughness to the obtained cured product, but when a cross-linking agent having many chained siloxane units is used in the following component ($a_2$), it may be used instead. In any case, it is preferable that the mass ratio of the component having a large number of branched siloxane units to the component having a large number of chained siloxane units is within the range of 50:50 to 100:0, or within the range of 60:40 to 100:0. This is because the hardness and mechanical strength of the obtained cured product are good when the mass ratio of the component having a large number of branched siloxane units to the component having a large number of chained siloxane units is within the above range.

When component ($a_1$) is radically reacted by an organic peroxide, component ($a_{1-1}$) and component ($a_{1-2}$) may be reacted within the range of 10:90 to 90:10, and component ($a_2$) may not be used.

Component ($a_2$) is a component for crosslinking component ($a_{1-1}$) and/or component ($a_{1-2}$) in the hydrosilylation reaction, and is an organopolysiloxane containing at least two silicon atom bonded hydrogen atoms in one molecule. As a group bonded to a silicon atom other than a hydrogen atom in component ($a_2$), an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, an epoxy group-containing group, or a hydroxyl group is exemplified, and the same groups as those described above are exemplified.

Such component ($a_2$) is not limited, but preferably is an organohydrogenpolysiloxane, represented by the average composition formula:

$$R^6{}_kH_mSiO_{(4-k-m)/2}$$

In the formulae, $R^6$ is an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the above $R^1$ are exemplified, and preferably a methyl group or a phenyl group.

In the formula, k is a number in the range of 1.0 to 2.5, preferably in the range of 1.2 to 2.3, m is a number in the range of 0.01 to 0.9, preferably in the range of 0.05 to 0.8, and k+m is a number in the range of 1.5 to 3.0, preferably in the range of 2.0 to 2.7.

Component ($a_2$) may be a resinous organohydrogenpolysiloxane having a large number of branched siloxane units, or the component may be a chained organohydrogenpolysiloxane having a large number of chained siloxane units. Specifically, examples of component ($a_2$) include an organohydrogenpolysiloxane represented by the following ($a_{2-1}$), an organohydrogenpolysiloxane represented by the following ($a_{2-2}$), or mixtures thereof.

Component ($a_{2-1}$) is an organopolysiloxane having a silicon-bonded hydrogen atom, expressed by the average unit formula:

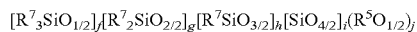

In the formula, each $R^7$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, or a hydrogen atom, and the same groups as the above $R^1$ are exemplified. Furthermore, in the formula, $R^5$ represents a hydrogen atom or an alkyl group having 1 to 6 carbon atoms, and the same groups as described above are exemplified.

In the formula, f is a number within the range of 0 to 0.7, g is a number within the range of 0 to 0.7, h is a number within the range of 0 to 0.9, i is a number within the range of 0 to 0.7, j is a number within the range of 0 to 0.1, h+i is a number within the range of 0.3 to 0.9, and f+g+h+i is 1; preferably f is a number within the range of 0 to 0.6, g is a number within the range of 0 to 0.6, h is a number within the range of 0 to 0.9, i is a number within the range of 0 to 0.5, j is a number within the range of 0 to 0.05, h+i is a number within the range of 0.4 to 0.9, and f+g+h+i+i is 1.

Component ($a_{2-2}$) is an organopolysiloxane having at least two silicon atom bonded hydrogen atoms in one molecule, expressed by the average unit formula:

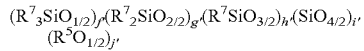

In the formula, R7 and R5 are the same groups as described above.

In the formula, f' is a number within the range of 0.01 to 0.3, g' is a number within the range of 0.4 to 0.99, h' is a number within the range of 0 to 0.2, i' is a number within the range of 0 to 0.2, j' is a number within the range of 0 to 0.1, h'+i' is a number within the range of 0 to 0.2, and f'+g'+h'+i' is 1; preferably f' is a number within the range of 0.02 to 0.20, g' is a number within the range of 0.6 to 0.99, h' is a number within the range of 0 to 0.1, i' is a number within the range of 0 to 0.1, j' is a number within the range of 0 to 0.05, h'+i' is a number within the range of 0 to 0.1, and f'+g'+h'+i' is 1.

As described above, in component ($a_2$), the resinous organopolysiloxane having many branched siloxane units imparts hardness and mechanical strength to the cured product, and the obtained organopolysiloxane having many chained siloxane units imparts toughness to the cured product, and therefore, it is preferable to appropriately use component ($a_{2-1}$) and component ($a_{2-2}$) as component ($a_2$). Specifically, when the number of branched siloxane units in component ($a_1$) is small, it is preferable to mainly use component ($a_{2-1}$) as component ($a_2$), and when the number of chained siloxane units in component ($a_1$) is small, it is preferable to mainly use component ($a_{2-2}$). Component ($a_2$) preferably has a mass ratio of component ($a_{2-1}$) to component ($a_{2-2}$) within the range of 50:50 to 100:0, or within the range of 60:40 to 100:0.

As component ($a_2$), the following organopolysiloxanes are exemplified. In the formula, Me and Ph represent a methyl group and a phenyl group, respectively.

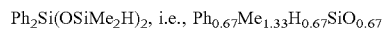

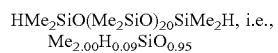

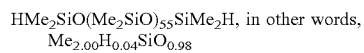

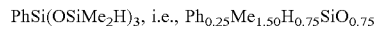

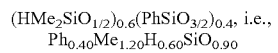

The amount of component ($a_2$) to be added is such that the molar ratio of silicon atom bonded hydrogen atoms in component ($a_2$) to the alkenyl groups in component ($a_1$) is in an amount of 0.2 to 0.7, preferably in an amount of 0.3 to 0.6. This is because the hardness and the mechanical strength of the obtained cured product are good when the amount of component ($a_2$) to be added is within the above ranges.

The organic peroxide used for radically reacting component ($a_1$) is not limited, and the organic peroxides exemplified by component (C) below can be used. In the radical reaction, component ($a_1$) is preferably a mixture of component ($a_{1-1}$) and component ($a_1$-2) in the mass ratio ranging from 10:90 to 90:10. Although the amount of the organic peroxide to be added is not limited, it is preferably within the range of 0.1 to 5 parts by mass, within the range of 0.2 to 3 parts by mass, or within the range of 0.2 to 1.5 parts by mass, based on 100 parts by mass of component ($a_1$).

The hydrosilylation reaction catalyst used for the hydrosilylation reaction of component ($a_1$) and component ($a_2$) is not limited, and a hydrosilylation reaction catalyst exemplified by component (C) below can be used. The amount of the hydrosilylation reaction catalyst to be added is preferably an amount in which platinum-based metal atoms in the hydrosilylation reaction catalyst are within the range of 0.01 to 500 ppm, within the range of 0.01 to 100 ppm, or within the range of 0.01 to 50 ppm in terms of mass units, with regard to the total amount of component ($a_1$) and component ($a_2$).

The above component (A3) is obtained by condensing the following component ($a_3$) and the following component ($a_4$) with a condensation reaction catalyst.

Component ($a_3$) is a condensation reactive organopolysiloxane, expressed by the average unit formula:

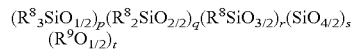

In the formula, each $R_8$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. Furthermore, in the formula, $R^9$ is a hydrogen atom, an alkyl group having 1 to 6 carbon atoms, or an acyl group having 2 to 5 carbon atoms, and an alkoxy group such as a methoxy group or an ethoxy group and an acyloxy group are exemplified. Component ($a_3$) has at least one silicon-bonded hydroxyl group, silicon-bonded alkoxy group, or silicon-bonded acyloxy group in one molecule. In addition, it is preferable that in one molecule, at least two $R^8$ is an alkenyl group, and 10 mol % or more, or 20 mol % or more of the total $R^8$ is a phenyl group.

In the formula, p is a number within the range of 0 to 0.7, q is a number within the range of 0 to 0.7, r is a number within the range of 0 to 0.9, s is a number within the range of 0 to 0.7, t is a number within the range of 0.01 to 0.10, r+s is a number within the range of 0.3 to 0.9, and p+q+r+s is 1; preferably p is a number within the range of 0 to 0.6, q is a number within the range of 0 to 0.6, r is a number within the range of 0 to 0.9, s is a number within the range of 0 to 0.5, t is a number within the range of 0.01 to 0.05, and r+s is a number within the range of 0.4 to 0.9. This is because, when p, q, and r+s are each a number within the above range, a hot-melt silicone having flexibility at 25° C. but non-fluidity, low surface tack, and sufficiently low melt viscosity at high temperature is obtained.

Component ($a_4$) is a condensation reactive organopolysiloxane, expressed by the average unit formula:

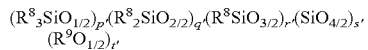
$(R^8{}_3SiO_{1/2})_{p'}(R^8{}_2SiO_{2/2})_{q'}(R^8SiO_{3/2})_{r'}(SiO_{4/2})_{s'}(R^9O_{1/2})_{t'}$ In the formula, $R^8$ and $R^9$ are the same groups as described above. Component ($a_4$) has at least one silicon-bonded hydroxyl group, silicon-bonded alkoxy group, or silicon-bonded acyloxy group in one molecule. In the formula, p' is a number within the range of 0.01 to 0.3, q' is a number within the range of 0.4 to 0.99, r' is a number within the range of 0 to 0.2, s' is a number within the range of 0 to 0.2, t' is a number within the range of 0 to 0.1, r'+s' is a number within the range of 0 to 0.2, and p'+q'+r'+s' is 1; preferably p' is a number within the range of 0.02 to 0.20, q' is a number within the range of 0.6 to 0.99, r' is a number within the range of 0 to 0.1, s' is a number within the range of 0 to 0.1, t' is a number within the range of 0 to 0.05, and r'+s' is a number within the range of 0 to 0.1. This is because, when p', q', r', and s' are each a number within the above range, a hot-melt silicone having flexibility at 25° C. but non-fluidity, low surface tack, and sufficiently low melt viscosity at high temperature is obtained.

The condensation reaction catalyst for condensation reaction of component ($a_3$) and component ($a_4$) is not limited, and examples thereof include organic tin compounds such as dibutyltin dilaurate, dibutyltin diacetate, tin octenate, dibutyltin dioctate, and tin laurate; organic titanium compounds such as tetrabutyl titanate, tetrapropyl titanate, and dibutoxy bis(ethyl acetoacetate); acidic compounds such as hydrochloric acid, sulfuric acid, and dodecylbenzene sulfonic acid; alkaline compounds such as ammonia and sodium hydroxide; and amine-based compounds such as 1,8-diazabicyclo[5.4.0]undecene (DBU), 1,4-diazabicyclo[2.2.2]octane (DABCO), and preferably an organic tin compound, and an organic titanium compound.

Component (A3) is a block copolymer composed of a resinous organosiloxane block and a chained organosiloxane block. Such component (A3) is preferably comprised of 40 to 90 mol % of disiloxy units of the formula [$R^1{}_2SiO_{2/2}$], 10 to 60 mol % of trisiloxy units of the formula [$R^1SiO_{3/2}$], and preferably contains 0.5 to 35 mol % of silanol groups [≡SiOH]. Here, each $R^1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. At least two $R^1$ in one molecule is an alkenyl group. Further, component (A3) is a resinous organosiloxane block copolymer in which the disiloxy unit [$R^1{}_2SiO_{2/2}$] forms a linear block having on average 100 to 300 disiloxy units per one linear block; the trisiloxy unit [$R^1SiO_{3/2}$] forms a non-linear block having a molecular weight of at least 500 g/mol; at least 30% of the non-linear blocks are bonded to each other; each linear block is bonded to at least one non-linear block via a —Si—O—Si— linkage; the resinous organosiloxane block copolymer having a mass-average molecular weight of at least 20000 g/mol, and containing at least one alkenyl group of 0.5 to 4.5 mol %.

Component (A3) is prepared by condensation reaction of ($a_5$) a resinous organosiloxane or a resinous organosiloxane block copolymer with ($a_6$) a chained organosiloxane, and optionally ($a_7$) a siloxane compound.

Component ($a_5$) is a resinous organopolysiloxane, expressed by the average unit formula:

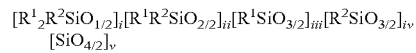
$[R^1{}_2R^2SiO_{1/2}]_i[R^1R^2SiO_{2/2}]_{ii}[R^1SiO_{3/2}]_{iii}[R^2SiO_{3/2}]_{iv}[SiO_{4/2}]_v$ In the formula, each $R^1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. In addition, in the formula, each $R^2$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified.

Also, in the formula, i, ii, iii, iv, and v represent the mole fraction of each siloxy unit, i is a number from 0 to 0.6, ii is a number from 0 to 0.6, iii is a number from 0 to 1, iv is a number from 0 to 1, and v is a number from 0 to 0.6, with the proviso that (ii+iii+iv+v)>0 and (i+ii+iii+iv+v)≤1. In addition, component ($a_5$) preferably contains 0 to 35 mol % of a silanol group [≡SiOH] in one molecule.

Component ($a_6$) is a straight-chain organosiloxane expressed by the general formula:

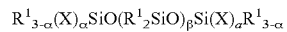
$R^1{}_{3-\alpha}(X)_\alpha SiO(R^1{}_2SiO)_\beta Si(X)_\alpha R^1{}_{3-\alpha}$ In the formula, $R^1$ is the same as described above, and the same groups as described above are exemplified. In addition, in the formula, X is a hydrolyzable group selected from —$OR^5$, F, Cl, Br, I, —$OC(O)R^5$, —$N(R^5)_2$, or —ON=$CR^5{}_2$, (wherein $R^5$ is a hydrogen atom or an alkyl group having 1 to 6 carbon atoms). Furthermore, in the formula, a is independently 1, 2, or 3, and 13 is an integer of 50 to 300.

Component ($a_7$) is a siloxane compound expressed by general formula:

$R^1R^2{}_2SiX$

In the formula, $R^1$, $R^2$, and X are the same groups as described above.

The condensation reaction catalyst for condensation reaction of component ($a_5$) and component ($a_6$) and/or component ($a_7$) is not limited, and examples thereof include organic tin compounds such as dibutyltin dilaurate, dibutyltin diacetate, tin octenate, dibutyltin dioctate, and tin laurate; organic titanium compounds such as tetrabutyl titanate, tetrapropyl titanate, and dibutoxy bis(ethyl acetoacetate); acidic compounds such as hydrochloric acid, sulfuric acid, and dodecylbenzene sulfonic acid; alkaline compounds such as ammonia and sodium hydroxide; amine-based compounds such as 1,8-diazabicyclo[5.4.0]undecene (DBU), 1,4-diazabicyclo[2.2.2]octane (DABCO).

Component (A1) preferably exhibits hot-melt properties, specifically, is non-fluid at 25° C. and preferably has a melt viscosity of 8,000 Pa·s or less at 100° C. Non-fluid refers to not flowing in a no-load condition, for example, the state of being lower than the softening point measured by the softening point testing method in the ball and ring method of hot melt adhesives specified in "Testing methods for the softening point of hot melt adhesives" of JIS K 6863-1994. That is, in order to be non-fluid at 25° C., the softening point must be higher than 25° C.

Component (A1) preferably has a melt viscosity at 100° C. of 8000 Pa·s or less, 5000 Pa·s or less, or within the range of 10 to 3000 Pa·s. Moreover, when the melt viscosity at 100° C. is within the abovementioned range, favorable adhesiveness after being hot melted and then cooled at 25° C. is obtained.

As long as component (A1) is in the form of microparticulates, the particle diameter is not limited, but the average primary particle diameter is preferably within the range of 1 to 5,000 μm, within the range of 1 to 500 μm, within the range of 1 to 100 μm, within the range of 1 to 20 μm, or within the range of 1 to 10 μm. The average primary particle diameter can be obtained, for example, by observation with an optical microscope or an SEM. The shape of component (A1) is not limited, and examples include a spherical shape, a spindle shape, a plate shape, a needle shape, and an irregular shape, and a spherical shape or a true spherical shape are preferable for uniform melting. In particular, by making component (A1) a spherical shape of 1 to 10 μm, the melting properties and the mechanical properties after curing of this compound can be favorably improved.

The method for manufacturing component (A1) is not limited, and a known method can be used. For example, component (A1) is simply atomized, or the process for crosslinking at least two kinds of organopolysiloxanes and the process for atomizing the reactants can be performed simultaneously or separately. In obtaining the microparticle component (A1), some of the components (C) described below, such as, for example, a hydrosilylation reaction catalyst, may be atomized together with component (A1), and is preferred.

As a method for atomizing the obtained organopolysiloxane after crosslinking at least two types of organopolysiloxanes, for example, a method of pulverizing the organopolysiloxane using a pulverizer or a method of directly pulverizing the silicone in the presence of a solvent can be cited. The pulverizer may be, for example, but not limited to, a roll mill, a ball mill, a jet mill, a turbo mill, or a planetary mill. As a method of directly atomizing the silicone in the presence of a solvent, for example, spraying by a spray dryer, or atomization by a biaxial kneader or a belt dryer can be cited. In the present invention, the use of spherical hot-meltable organopolysiloxane resin microparticles obtained by spraying with a spray dryer is particularly preferable from the viewpoints of the melting characteristics of the granular compound, the flexibility of the cured product, the compounded amount of component (B), efficiency during manufacture, and the workability of the composition.

By using a spray dryer or the like, component (A1) having a true spherical shape and an average primary particle diameter of 1 to 500 μm can be produced. The heating and drying temperature of the spray dryer needs to be appropriately set based on the heat resistance and the like of the organopolysiloxane resin microparticles. In order to prevent secondary aggregation of the organopolysiloxane resin microparticles, the temperature of the organopolysiloxane resin microparticles is preferably controlled below the glass transition temperature thereof. The organopolysiloxane resin microparticles thus obtained can be recovered by a cyclone, a bag filter, or the like.

In order to obtain a uniform component (A1), a solvent may be used in the above-mentioned step within the range that does not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

[Component (A2-1)]

Component (A2-1) is one of the base compounds of the composition used together with component (A2-2), and is organopolysiloxane resin microparticles containing a curing reactive functional group that does not have hot-melt properties alone, or organopolysiloxane resin microparticles mixture containing the same. Such component (A2-1) must be in the form of microparticles together with other components (for example, component (A2-2), which is a straight or branched chain organopolysiloxane, component (A2-1-1), which is a non-reactive organopolysiloxane resin microparticle, and component (C), which is a curing agent), and the silicone particulate is in particular preferably spherical with an average primary particle diameter of 1 to 20 μm.

Component (A2-1) must have a curing-reactive group having a carbon-carbon double bond in the molecule. This type of a curing-reactive group is a hydrosilylation reactive, radical reactive, or an organic peroxide curing functional group that forms a cured product based on a crosslinking reaction with other components.

Component (A2-1) is an organopolysiloxane resin microparticle that does not have hot-melt properties as a whole molecule and is solid in a solvent-free state. Here, the absence of hot-melt properties means that the resin particles, which are component (A2-1), do not exhibit heating and melting behavior, and specifically means that they do not have a softening point and melt viscosity at a temperature of 200° C. or lower by themselves. In component (A2-1), such properties are not structurally restricted, but it is preferred that the functional group in the organopolysiloxane resin is a monovalent hydrocarbon group having 1 to 10 carbon atoms, in particular a functional group selected from an alkenyl group or an alkyl group having 1 to 10 carbon atoms such as a methyl group, and substantially free of aryl groups such as a phenyl group. If the component contains a large amount of phenyl groups, or the like, it may become hot-melt-able and the coloration resistance of the cured product under heating and aging (high temperature) described below may be reduced. Suitably, the functional group bonded to the silicon atom in component (A2-1) is a group selected from a methyl group and an alkenyl group such as a vinyl group, and it is preferable that 70 to 99 mol % of the functional group bonded to all silicon atoms is a methyl group, and it is more preferable that 80 to 99 mol % of the functional group bonded to all silicon atoms is a methyl group, and it is particularly preferable that 88 to 99 mol % of the functional group bonded to all silicon atoms is a methyl group, and that all other functional groups bonded to silicon atoms is an alkenyl group such as a vinyl group. In such a range, component (A2-1) can be designed not as a hot-melt component but as a component that is particularly superior in coloration resistance, and the like at high temperatures of the cured product. A small amount of a hydroxyl group or an alkoxy group may be included in said component (A2-1).

Component (A2-1) is organopolysiloxane resin microparticles that are solid in a solvent-free state, and characterized in that it contains in its molecule a siloxane unit represented by $SiO_{4/2}$ making up at least 20 mol % or more of the total siloxane units. Suitably, these branched siloxane units are at least 40 mol % of the total siloxane units, and it is particularly preferred that they are at least 50 mol %, and in particular in the range of 50 to 90 mol %. R is a monovalent organic group, suitably a functional group selected from a monovalent hydrocarbon group having 1 to 10 carbon atoms, particularly an alkenyl group or an alkyl group having 1 to 10 carbon atoms such as a methyl group, and from the viewpoint of technical effectiveness, the R preferably does not substantially contain an aryl group such as a phenyl group.

In other words, component (A2-1) is suitably, (A2-1-1) an organopolysiloxane resin microparticle made up of a siloxane unit represented by $SiO_{4/2}$ making up at least 20 mol % or more of the total siloxane units having a curing reactive functional group containing a carbon-carbon double bond in the molecule and no hot-melt properties as a whole molecule.

Similarly, component (A2-1) may be an organopolysiloxane resin microparticle mixture made up of a siloxane unit represented by $SiO_{4/2}$ making up at least 20 mol % or more of the total siloxane units having a curing reactive functional group containing at least 1 carbon-carbon double bond in the molecule and no hot-melt properties as component (A2-1-1) or a whole molecule (A2-1-2).

[Component (A2-1-1)]

Component (A 2-1-1) of the present invention is a non-hot-meltable organopolysiloxane resin microparticle which does not have a curing reactive functional group containing a carbon-carbon double bond in its molecule.

Component (A2-1-1) is an organopolysiloxane resin microparticle that is a siloxane unit represented by $SiO_{4/2}$ making up at least 20 mol % or more of the total siloxane units, does not have hot melt properties as a whole molecule, and does not have a curing reactive functional group containing a carbon-carbon double bond in the molecule. By using this component as part of component (A2-1) in combination with component (A2-2), a straight or branched chain organopolysiloxane within a predetermined quantitative range, the hot melt properties of the entire composition are improved.

Component (A2-1-1) is an organopolysiloxane resin microparticle that does not have hot-melt properties as a whole molecule and is solid in a solvent-free state. Here, the absence of hot-melt properties means that the resin particles, which are component (A2-1-1), do not exhibit heating and melting behavior, and specifically means that they do not have a softening point or melt viscosity at a temperature of 200° C. or lower by themselves, as already explained for component (A2-1).

The functional group bonded to the silicon atom in component (A2-1-1) is suitably a methyl group, and 70 mol % or more of the functional group bonded to all the silicon atoms is preferably a methyl group, more preferable that 80 mol % or more is a methyl group, and in particular preferably 88 mol % or more is a methyl group. In such a range, component (A) is not hot-meltable, and can be designed as a component that is particularly excellent in coloration resistance, and the like at high temperatures of the cured product thereof. A small amount of a hydroxyl group or an alkoxy group may be included in said component (A).

Since component (A2-1-1) does not have a curing-reactive group having a carbon-carbon double bond in the molecule, it does not form a cured product by itself. However, it has a reinforcing effect on the cured product and improves the hot melt properties of the composition as a whole and can be used as a part of component (A2-1) having curability.

Component (A2-1-1) is an organopolysiloxane resin microparticle that is solid in a solvent-free state, and is a siloxane unit represented by $SiO_{4/2}$ making up at least 20 mol % or more of the total siloxane units, which is a branched siloxane unit in the molecule. Suitably, said siloxane units are at least 40 mol % of the total siloxane units, and the siloxane units are preferably 50 mol % or more, and particularly preferably in the range of 50-65 mol %.

Suitably, component (A2-1-1) is an organopolysiloxane resin particle not having any hot-melt properties represented by the following (A1) average unit formula: $(R^1_3SiO_{1/2})_a(R^1_2SiO_{2/2})_b(R^1SiO_{3/2})_c(SiO_{4/2})_d(R^2O_{1/2})_e$ (In the formula, each $R^1$ independently has from 1 to 10 carbon atoms and is a monovalent hydrocarbon group that does not contain carbon-carbon double bonds; each $R^2$ is a hydrogen atom or an alkyl group having 1 to 10 carbon atoms; and a, b, c, d, and e are numbers satisfying the following: $0.10 \leq a \leq 0.60$, $0 \leq b \leq 0.70$, $0 \leq c \leq 0.80$, $0.20 \leq d \leq 0.65$, $0 \leq e \leq 0.05$, and $a+b+c+d=1$).

In the above average unit formula, each $R^1$ independently has from 1 to 10 carbon atoms, and is a monovalent hydrocarbon group that does not contain any carbon-carbon double bonds, such as methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. Herein, from the viewpoint of industrial production and the technical effect of the invention, 70 mol % or more of all $R^1$ in one molecule is preferably an alkyl group having 1 to 10 carbon atoms, such as a methyl group, and particularly preferable that 88 mol % or more is a methyl group. On the other hand $R^1$ is preferably substantially free of an aryl group such as a phenyl group. If a large amount of aryl groups such as phenyl groups is contained, component (A) itself may become hot-meltable and the technical effect of the present invention may not be achieved, and the coloration resistance of the cured product at high temperatures may deteriorate.

In the formula, $R^2$ is an alkyl group having a hydrogen atom or 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A 2-1-1).

In the formula, "a" is a number indicating the percentage of siloxane units in the general formula: $R^1{}_3SiO_{1/2}$. This number satisfies $0.1 \leq a \leq 0.60$, preferably $0.15 \leq a \leq 0.55$. If a is at or above the lower limit of the aforementioned range, then the composition containing the component, the composition as a whole can achieve favorable hot melt properties. On the other hand, if a is less than or equal to the upper limit of the aforementioned range, the mechanical strength (hardness, and the like) of the cured product obtained is not too low.

In the formula, "b" is a number indicating the percentage of siloxane units in the general formula: $R^1{}_2SiO_{2/2}$. This number satisfies $0 \leq b \leq 0.70$, preferably $0 \leq b \leq 0.60$. If b is less than or equal to the upper limit of the range, the composition containing the component can achieve favorable hot melt performance as an entire composition, and a granular composition with little stickiness at room temperature can be obtained. In the present invention, b may be and is preferred to be 0.

In the formula, "c" is a number indicating the percentage of siloxane units in the general formula: $R^1SiO_{3/2}$. This number is given by $0 \leq c \leq 0.70$ and preferably satisfies $0 \leq c \leq 0.60$. If c is less than or equal to the upper limit of the range, the composition containing the component can achieve favorable hot melt performance as an entire composition, and a granular composition with little stickiness at room temperature can be obtained. In the present invention, c may be and is preferred to be 0.

In the formula, d is the ratio of $SiO_{4/2}$ and is a number indicating the ratio of siloxane units of $0.20 \leq d \leq 0.65$, and $0.40 \leq d \leq 0.65$ is preferable, and $0.50 \leq d \leq 0.65$ is particularly preferable. Within this numerical range, the composition containing this component can achieve favorable hot melt performance as an entire composition, excellent mechanical strength of the resulting cured product, and good workability without stickiness as an entire composition.

In the formula, "e" is a number indicating the percentage of units in the general formula: $R^2O_{1/2}$, wherein the units are a hydroxyl group or alkoxy group bonded to a silicon atom that can be contained in the organopolysiloxane resin. This number satisfies $0 \leq e \leq 0.05$, preferably $0 \leq e \leq 0.03$. If e is below the upper limit of the range, a material that achieves favorable hot melt performance as an entire composition can be obtained. Note that the sum of a, b, c and d, which is the sum of each of the siloxane units, is equal to 1.

The (A2-1-1) component is a microparticulate organopolysiloxane resin having the characteristics described above, and is suitably a spherical organopolysiloxane resin microparticle having an average primary particle diameter of 1 to 20 μm, as measured by a laser diffraction/scattering method or the like. By using such a particulate component, the composition can be prepared or produced as a curable granular composition having superior workability and hot-melt properties. Herein, the method for manufacturing component (A2-1-1) is not limited and examples include the same methods as those indicated for component (A1) above. In addition, when obtaining the microparticulate component (A2-1-1), component (C) described below, such as a hydrosilylation reaction catalyst, may be and is preferred to be atomized together with component (A2-1-1).

When component (A2-1) of the present invention is a mixture including a non-reactive component (A 2-1-1), for 100 mass parts of component (A2-1-1), blending reactive organopolysiloxane resin microparticles in a range of 3 to 50 mass parts is preferable.

More specifically, component (A2-1) of the present invention is preferably a mixture of
(A2-1-1) 100 mass parts of organopolysiloxane resin microparticles with a siloxane unit represented by $SiO_{4/2}$ making up at least 20 mol % or more of the total siloxane units having no hot-melt properties as a whole molecule while having a curing reactive functional group with a carbon-carbon double bond in the molecule, and
(A2-1-2) 3 to 50 mass parts of an organopolysiloxane resin microparticle made up of a siloxane unit represented by $SiO_{4/2}$ making up at least 20 mol % or more of the total siloxane units having a curing reactive functional group containing at least 1 carbon-carbon double bond in the molecule and no hot-melt properties as a whole molecule.

[Component (A2-2)]

Component (A2-2) is one of the base compounds of the composition used together with component (A2-1), and is a straight or branched chain organopolysiloxane that is liquid at 25° C. and has a curing reactive functional group containing at least two carbon-carbon double bonds in the molecule. This manner of curing-reactive chain-like organopolysiloxane, when mixed with the aforementioned solid organopolysiloxane resin particles, develops hot melt properties as an entire composition.

Similarly to component (A2-1), component (A2-2) must have a curing-reactive group having a carbon-carbon double bond in the molecule. This type of a curing-reactive group is a hydrosilylation reactive, radical reactive, or organic peroxide curing functional group that forms a cured product based on a crosslinking reaction with other components. This manner of curing-reactive group is an alkenyl group or an acrylic group, and examples are the same groups described above, and a vinyl group or a hexenyl group are in particular preferable.

Component (A2-2) is a straight or branched chain organopolysiloxane in a liquid state at 25° C. (room temperature), and when mixed with component (A2-1) in a solid state at room temperature and optionally with the component (A2-1-2) described below, the composition as a whole exhibits hot melt-ability. The structure thereof can be based on a branched-chain organopolysiloxane having a small number of branched siloxane units (for example, T units represented by the general formula: $R^4SiO_{3/2}$ ($R^4$ represents independent monovalent hydrocarbon groups having 1 to 10 carbon atoms) or Q units represented by $SiO_{4/2}$), and is suitably a straight-chain organopolysiloxane (A2-2-1) expressed by the following structural formula:

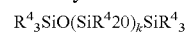

(In the formula, each $R^4$ is independently a monovalent hydrocarbon group having 1 to 10 carbon atoms, except that at least two of the $R^4$ in one molecule is an alkenyl group, and k is a number from 20 to 5,000)

Suitably, a straight-chain diorganopolysiloxane having an alkenyl group at both molecular terminals is preferred.

In the formula, each $R^4$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group. Furthermore, at least two of the $R^4$ in one molecule are alkenyl groups, preferably vinyl groups. It is also preferred that each $R^4$ is a functional group preferably selected from an alkyl group having 1 to 10 carbon atoms such as a methyl group and an alkenyl group such as a vinyl group or a hexenyl group, and it is particularly preferable that of all $R^4$, at least two are alkenyl groups, and the remaining $R^4$ are methyl groups. It should be noted that from the viewpoint of the technical effect of the invention, it is preferable that $R^4$ is substantially free of an aryl group such as a phenyl group. If it contains a large amount of aryl groups such as phenyl groups, the coloration resistance of the cured product at high temperatures may deteriorate. Particularly suitable is having an alkenyl group such as a vinyl group at both molecular terminals, the rest of the $R^4$ being methyl groups.

In the formula, k is a number between 20 and 5,000, preferably between 30 and 3,000, and particularly preferably between 45 and 800. If k is at or above the lower limit of the aforementioned range, a granular composition having little stickiness at room temperature can be obtained. On the other hand, if k is below the upper limit of the aforementioned range, the composition as a whole can achieve favorable hot melt performance.

[Mixture Containing Non-Hot-Melt Organopolysiloxane Resin Microparticles]

When the component (A 2-1-2), component (A 2-1-1), and component (A2-2) described above are used as component (A) of the present invention, relative to 100 mass parts of component (A2-1-1), the amount of component (A2-1-2) used is in the range of 3 to 50 mass parts, and the range of 4 to 45 mass parts is particularly preferable. Here, since component (A2-1-2), together with component (A2-2), is a component that grants the silicone composition curing reactive properties, if it is less than the lower limit described above, the curing properties and the curing speed may be reduced. If the aforementioned upper limit is exceeded, the technical effect of high stress relief properties of the cured product may not be achieved, particularly when a large amount of functional filler is blended into the composition in question.

Although there are no limitations regarding combining the above component (A2-1-1, 2) and component (A2-2), it is preferable to select a combination in which the molecular weights are different, such as component (A2-1-1, 2), which is an organopolysiloxane resin particle, and component (A2-2), which is a straight or branched chain organopolysiloxane. That is, a combination of a relatively small molecular weight component (A2-1-1, 2) and a relatively large molecular weight component (A2-2); or a combination of a relatively large molecular weight component (A2-1-1, 2) and a relatively small molecular weight component (A2-2) is preferred from the viewpoint of atomization. On the other hand, if components with relatively small molecular weights are combined, they may be incompatible and cannot be made into particles. In the combination of a high molecular weight MQ resin and a large molecular weight (long chain) vinyl polysiloxane disclosed in Patent Document 3, the melt viscosity of the mixture tends to be high, and in order to produce a composition with low melt viscosity in the composition of the present invention to which the functional inorganic filler described below is added, the fill amount of the inorganic filler must be small in order to produce a composition having a low melt viscosity.

[Component (B)]

Component (B) of the present invention is a functional inorganic filler, which is preferably at least one filler that does not have a softening point or does not soften below 50° C. It may be a component that improves the workability of the composition and imparts mechanical or other properties to the cured product of the composition. Examples of component (B) include inorganic fillers, organic fillers, and mixtures thereof, and inorganic fillers are preferable. Examples of this inorganic filler include reinforcing fillers, white pigments, thermally conductive fillers, electrically conductive fillers, phosphors, and mixtures of at least two types thereof, and the composition preferably contains a reinforcing filler that does not substantially contain coarse particles having an average particle diameter of 5 µm or more. Examples of the organic filler include a silicone resin filler, a fluorine resin filler, and a polybutadiene resin filler. The shape of these fillers is not particularly limited, and may be spherical, spindle-shaped, flat, needle-shaped, amorphous, or the like.

When the present composition is used for applications such as sealants, protective agents, adhesives, light reflecting materials, etc., since it imparts mechanical strength to the cured product and improves the protective property or adhesiveness, it is preferable to incorporate a reinforcing filler as component (B). Examples of the reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface treated with organoalkoxysilanes such as methyltrimethoxysilane; organohalosilanes such as trimethylchlorosilane; organosilazanes such as hexamethyldisilazane; siloxane oligomers such as α,ω-silanol group-blocked dimethylsiloxane oligomers, α,ω-silanol group-blocked methylphenylsiloxane oligomers, α,ω-silanol group-blocked methylvinylsiloxane oligomers, and the like. Further, as the reinforcing filler, a fibrous filler such as calcium metasilicate, potassium titanate, magnesium sulfate, sepiolite, zonolite, aluminum borate, rock wool, glass fiber, or the like may be used.

Particularly, from the viewpoint of providing the present composition with favorable gap-filling properties upon melting, component (B) is preferably a mixture of (b1) an inorganic filler having an average particle diameter of 0.1 µm or less, suitably a reinforcing filler, and (b2) an inorganic filler having an average particle diameter of 0.1 to 5.0 µm, suitably a reinforcing filler. The ratio of the two is arbitrary, but may be a mass ratio of 1/99 to 20/80, 1/99 to 50/50, or 5/95 to 40/60. In particular, containing (b1-1) fumed silica having an average particle diameter of 0.1 µm or less, suitably 0.05 µm or less, and (b2-1) fused silica having an average particle diameter of 0.1 to 5.0 µm, suitably 0.15 to 4.0 µm, in a mass ratio of 1/99 to 20/80 suitably 1/99 to 50/50, and more suitably a mass ratio of 5/95 to 40/60 is preferable. When the particles of such a mixture of inorganic fillers are the same or smaller in size than the particle size of component (A), a favorable silicon-filler matrix can be formed upon melting. This improves the flexibility and mechanical strength of the cured product. Favorable gap-filling properties can also be achieved from this kind of component (B), as the material is substantially free of coarse particles.

The curable granular silicone composition of the present invention can be used as a light reflective material, especially for optical semiconductor (LED) applications, and a white pigment may be used as component (B), since it imparts whiteness to the cured product and improves the light reflectivity. Examples of the white pigment include metal oxides such as titanium oxide, aluminum oxide, zinc oxide, zirconium oxide, magnesium oxide, and the like; hollow fillers such as glass balloons, glass beads, and the like; and otherwise barium sulfate, zinc sulfate, barium titanate, aluminum nitride, boron nitride, and antimony oxide. Titanium oxide has high optical reflectivity and concealing properties, and is therefore preferable. Furthermore, aluminum oxide, zinc oxide, and barium titanate have high optical reflectivity of a UV region, and are therefore preferable. Furthermore, a surface of the white pigment can be treated by a silane coupling agent, silica, aluminum oxide, and the like. Particularly suitable white pigments are titanium oxide microparticles having an average particle diameter of 0.5 μm or less, and by filling the composition with about 10 to 30% by volume, the cured product is granted with high light reflectance and concealing properties in the visible wavelength region, and furthermore, the light reflectance in the visible wavelength region does not readily change when comparing between low and high wavelengths.

Component (B) may contain silicone fine particles which do not correspond to component (A), and the stress relaxation characteristics and the like can be improved or adjusted as desired. Silicone fine particles include non-reactive silicone resin fine particles and silicone elastomer fine particles, but silicone elastomer fine particles are suitably exemplified from the standpoint of improving flexibility or stress relaxation properties.

The silicone elastomer fine particles are a crosslinked product of linear diorganopolysiloxane comprised of primarily of diorganosiloxy units (D-units). The silicone elastomer fine particles can be prepared by a crosslinking reaction of diorganopolysiloxane by a hydrosilylation reaction, a condensation reaction of a silanol group, or the like, and in particular, the silicone elastomer fine particles can be suitably obtained by a crosslinking reaction of organohydrogenpolysiloxane having a silicon bonded hydrogen atom at a side chain or a terminal with diorganopolysiloxane having an unsaturated hydrocarbon group such as an alkenyl group at a side chain or a terminal under a hydrosilylation reaction catalyst. The silicone elastomer fine particles may have various shapes such as spherical, flat, and irregular shapes, but are preferably spherical in terms of dispersibility, and among these, true spherical is more preferable. Commercial products of such silicone elastomer fine particles include, for example, "Torefil-E series" and "EP Powder series" manufactured by Dow Corning Toray Company, Ltd., and "KMP series" manufactured by Shin-Etsu Chemical Co., Ltd.

The silicone elastomer fine particles may be subjected to a surface treatment. Examples of the surface treatment agent include, for example, methylhydrogenpolysiloxane, silicone resin, metal soap, silane coupling agent, inorganic oxide such as silica and titanium oxide, fluorine compound such as perfluoroalkylsilane and perfluoroalkylphosphate ester salt.

When the present composition is used as a wavelength conversion material for an LED, a phosphor may be blended as component (B) to convert the emission wavelength from the optical semiconductor element. There is no particular limitation on this phosphor, and examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED). Examples of the oxide phosphors include yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. In the composition, two or more of these phosphors may be used in combination.

In addition, the composition may contain a thermally conductive filler or a conductive filler to impart thermal or electrical conductivity to the cured product. As the thermally conductive filler or the conductive filler, there are exemplified a metal fine powder such as gold, silver, nickel, copper, aluminum; a fine powder obtained by depositing or plating a metal such as gold, silver, nickel, copper or the like on the surface of a fine powder such as ceramic, glass, quartz, organic resin or the like; a metal compound such as aluminum oxide, magnesium oxide, aluminum nitride, boron nitride, zinc oxide or the like; graphite, and a mixture of two or more of these. When electrical insulation is required for the present composition, a metal oxide-based powder or a metal nitride-based powder is preferable, and in particular, an aluminum oxide powder, a zinc oxide powder, or an aluminum nitride powder is preferable.

Although the content of component (B) is not limited, it is preferably in the range of 10 to 50 vol % of the entire composition, and particularly suitably in the range of 10 to 40 vol %. If the content of component (B) exceeds the above-described upper limit, the resulting cured product tends to become hard, the tan δ value described below decreases, the workability of the composition and the gap-filling property during hot-melting, which are technical effects of the present invention, decrease, the flexibility and mechanical strength of the resulting cured product under room temperature to high temperature become insufficient, and the stress relief properties of the cured product may become insufficient.

[Component (C)]

Component (C) is a curing agent for curing component (A), and is not limited as long as component (A) can be cured. When component (A) has an alkenyl group, component (C) is an organohydrogenpolysiloxane having at least two silicon atom bonded hydrogen atoms in one molecule and a hydrosilylation reaction catalyst, when component (A) contains an alkenyl group and contains a hydrosilylation reaction catalyst, component (C) may be only an organopolysiloxane having at least two silicon atom bonded hydrogen atoms in one molecule, but a hydrosilylation reaction catalyst may be used in combination. In addition, when component (A) has an alkenyl group, component (C) may be an organic peroxide, but an organopolysiloxane having at least two silicon atom bonded hydrogen atoms may be used in combination in one molecule. On the other hand, when component (A) has a silicon atom bonded hydrogen atom, component (C) is an organopolysiloxane having at least two alkenyl groups in one molecule and a hydrosilylation reaction catalyst, when component (A) has a silicon atom bonded hydrogen atom and contains a hydrosilylation reaction catalyst, component (C) may be an organopolysiloxane having at least two alkenyl groups in one molecule, but a hydrosilylation reaction catalyst may be used in combination.

Examples of organopolysiloxanes in component (C) include organopolysiloxanes containing alkenyl groups represented by the above ($a_1$) and/or the above ($a_2$), or organopolysiloxanes containing silicon atom bonded hydrogen atoms represented by the above ($a_3$) and/or the above ($a_4$).

When an organopolysiloxane is used as component (C), the content thereof is not limited, but for curing the composition, it is preferable that the amount of silicon atom bonded hydrogen atoms is within the range of 0.5 to 20 mol or within the range of 1.0 to 10 mol with regard to 1 mol of alkenyl group in the composition.

As the hydrosilylation reaction catalyst, platinum-based catalysts, rhodium-based catalysts, and palladium-based catalysts are exemplified, with platinum-based catalysts being preferable because the curing of the present composition can be remarkably accelerated. Exemplary platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferable because the platinum-alkenyl siloxane complex has good stability. In addition, in terms of improving the handleability as well as the pot life of the composition, a platinum containing hydrosilylation reaction catalyst in fine particles dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst to be added is preferably an amount in which the metal atom is within the range of 0.01 to 500 ppm, an amount within the range of 0.01 to 100 ppm, or an amount within the range of 0.01 to 50 ppm in terms of mass units with regard to component (A).

Examples of organic peroxides include alkyl peroxides, diacyl peroxides, ester peroxides, and carbonate peroxides.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethyl-butylperoxyneodecanoate, α-cumylperoxyneodecanoate, tert-butylperoxyneodecanoate, tert-butylperoxyneoheptanoate, tert-butylperoxypivalate, tea-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of such organic peroxide include dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of organic peroxide is preferably within the range of 0.05 to 10 parts by mass, or within the range of 0.10 to 5.0 parts by mass, with regard to 100 parts by mass of component (A).

The present composition may also contain hot-melt microparticles, curing retardants and adhesion-granting agents other than component (A) as other optional components, as long as the purpose of the present invention is not impaired.

One or more types selected from various hot-melt synthetic resins, waxes, fatty acid metal salts, and the like can be used as hot-melt microparticles other than component (A). The wax component exhibits low kinematic viscosity at high temperatures (150° C.) and forms a melt with excellent flowability. In addition, by combining the components (A) to (C) described above, the wax component in the melt that makes up the present composition spreads quickly throughout the composition at high temperature, thereby lowering the viscosity of the substrate surface to which the molten composition is applied and of the composition as a whole, rapidly lowering the surface friction of the substrate and the molten composition, and significantly increasing the fluidity of the composition as a whole. Therefore, the viscosity and flowability of the molten composition can be greatly improved by adding only a very small amount to the total amount of other components.

The wax component may be a petroleum wax such as paraffin as long as it satisfies the conditions of drip point and kinematic viscosity at the time of melting described above, but from the viewpoint of the technical effect of the present invention, a hot melt component that makes up a fatty acid metal salt is preferable, and a metal salt of a higher fatty acid such as stearic acid, palmitic acid, oleic acid and isononanoic acid is particularly preferable. Here, the types of the fatty acid metal salts described above are also not particularly limited, and suitable examples include alkali metal salts such as lithium, sodium, potassium, and the like; alkaline earth metal salts such as magnesium, calcium, barium, and the like; or zinc salts.

Particularly suitable as the wax component are fatty acid metal salts having a free fatty acid content of 5.0% or less, 4.0% or less, and more preferably fatty acid metal salts with 0.05 to 3.5% of free fatty acid content. Examples of such a component include at least one or more stearic acid metal salts. From the viewpoint of the technical effect of the present invention, the present component preferably consists substantially only of one or more stearic acid metal salts, a hot-melt component with a melting point of 150° C. or less selected from calcium stearate (melting point 150° C.), zinc stearate (melting point 120° C.), and magnesium stearate (melting point 130° C.).

Regarding the amount of the wax component used, with the entire composition taken as 100 mass parts, the content of the component is in the range of 0.01 to 5.0 mass parts, and may be 0.01 to 3.5 mass parts or 0.01 to 3.0 mass parts. If the amount of the wax component used exceeds the upper limit, the adhesiveness and mechanical strength of the cured product obtained from the granular cured silicone composition of the present invention may be insufficient. If the amount used is less than the lower limit, sufficient fluidity while heating and melting may not be achieved.

Examples of the curing retardant include: alkyne alcohols such as 2-methyl-3-butyne-2-ol, 3,5-dimethyl-1-hexyne-3-ol, 2-phenyl-3-butyne-2-ol, and 1-ethynyl-1-cychlohexanol; enyne compounds such as 3-methyl-3-pentene-1-yne, and 3,5-dimethyl-3-hexene-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10000 ppm in terms of mass units, with regard to the composition.

As the adhesion imparting agent, an organosilicon compound having at least one alkoxy group bonded to a silicon atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicon atom of the organosilicon compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and a 7,8-epoxyoctyl group; acryl group-containing monovalent organic groups such as a 3-methacryloxypropyl group; and hydrogen atoms. This organosilicon compound preferably has a group that may react with an alkenyl group or a silicon atom-bonded hydrogen atom in this composition, and specifically, preferably has a silicon atom-bonded hydrogen atom or an alkenyl group. Moreover, because favorable adhesion can be imparted to various substrates, this organosilicon compound preferably has at least one epoxy group-containing monovalent organic group per one molecule. Examples of such an organosilicon compound include an organosilane compound, an organosiloxane oligomer, and an alkyl silicate. Exemplary molecular structures of this organosiloxane oligomer or alkyl silicate include a linear structure, a partially branched linear structure, a branched structure, a cyclic structure, and a network structure, among which a linear structure, a branched structure, and a network structure are particularly preferable. Examples of an organosilicon compound include: silane compounds such as 3-glycidoxypropyltrimethoxysilane, 2-(3,4-epoxycyclohexyl)ethyltrimethoxysilane, and 3-methacryloxypropyltrimethoxysilane; siloxane compounds having at least one silicon atom-bonded alkenyl group or at least one silicon atom-bonded hydrogen atom and at least one silicon atom-bonded alkoxy group; mixtures of silane compounds or siloxane compounds having at least one silicon atom-bonded alkoxy group and siloxane compounds having at least one silicon atom-bonded hydroxy group and at least one silicon atom-bonded alkenyl group in one molecule; methylpolysilicate; ethylpolysilicate; and an epoxy group-containing ethylpolysilicate. The adhesion imparting agent is preferably in the form of a low viscosity liquid, and the viscosity thereof is not limited, but is preferably within the range of 1 to 500 mPas at 25° C. In addition, while not limited thereto, the content of this adhesion imparting agent is preferably within the range of 0.01 to 10 parts by mass with regard to 100 parts by mass of the total of the present composition.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like; and dyes, pigments other than white, flame retardant agents, and the like may be contained as long as the purpose of the present invention is not impaired.

The composition described above, by using component (B) in combination with component (A) that is an organopolysiloxane resin microparticles or a mixture containing the same, in a specific ratio, has superior melting (hot melt) properties, the cured product is flexible at room temperature to high temperature, specifically, 25° C. to 150° C., has excellent stress relief properties, and has superior characteristics in that it is not easily damaged by bending or other deformation at room temperature. The above component (B) suitably contains an inorganic filler, but further functionality can feasibly be added, such as improved light reflectance, by using a white pigment, a thermally conductive filler, an electrically conductive filler, a phosphor, and the like.

[Storage Elastic Modulus of the Cured Product]

Specifically, the cured product resulting from curing the composition described above has a storage modulus (G') value at 25° C. of 2,000 MPa or less, and a storage modulus (G') value at 150° C. of 100 MPa or less. The cured product is flexible at both room temperature (25° C.) and high temperature (150° C.), has excellent adhesion and followability to substrates such as semiconductor substrates, and can be used for encapsulating semiconductor devices that are subject to deformation, such as flexible semiconductor substrates that have been introduced in recent years, suppressing damage to the encapsulated semiconductor device or generation of defects such as delamination and voids. For applications requiring particularly high elongation and deformation tracking, the value of the storage modulus (G') at 25° C. may be 1,500 MPa or less, or 1,000 MPa or less, and the value of the storage modulus (G') at 150° C. may be 50 MPa or less or 40 MPa or less.

[Peak Value and Peak Temperature of Loss Tangent (Tan δ) of Cured Product]

Further, the cured product comprising the cured composition of the present invention must have a peak loss tangent (tan δ) defined by the ratio of the storage modulus (G') to the loss modulus (G") at a frequency of 1.0 Hz, or in other words, G'/G", the peak value of the loss tangent (tan δ) defined by the loss tangent (tan δ) must be 0.40 or more, preferably 0.50 or more, and particularly preferably in the range of 0.50 to 0.80. If the peak value of the tan δ is less than 0.40, warpage or breakage of the molded product may occur, especially in thin film form or when it is integrally molded with an aluminum lead frame or the like. The peak temperature giving the peak value of tan δ is not particularly limited, but it is preferable that the peak temperature is in the range of 30 to 200° C., and the peak temperature is in particular preferably in the range of 40 to 150° C.

In the composition of the present invention, a cured product having excellent stress relief capability is formed by setting the peak value of tan δ above 0.4 or more, and in particular, by suitably selecting the components described above, a high peak value of tan δ can be realized even in a composition having a relatively high content of inorganic filler. Such cured products achieve superior low warpage capability in the large-area batch encapsulation process for semiconductors, which has been introduced in recent years. The peak value of tan δ described above can be controlled by the amount of the branched polyorganosiloxane component in component (A), the amount of the carbon-carbon double bond in component (A), and the amount of component (B).

[Use of the Present Composition]

The present composition may be used in pellet form. The pellets of the present composition are obtained by compression molding the present composition, and are excellent in handling workability and curability. The "pellet" may also be referred to as a "tablet". The shape of the pellet is not limited, but is usually spherical, elliptical spherical, or cylindrical. The size of the pellet is not limited, and for example, the pellet has an average particle diameter or a circle equivalent diameter of 500 μm or more.

The composition may be molded into a sheet and used. For example, a sheet made of a curable granular silicone composition having an average thickness of 100 to 1,000 μm is advantageous in that it has hot melt properties and heating-curability at high temperatures, and so in particular, demonstrates excellent workability and melting characteristics when used in compression molding or the like. Such a sheet-like composition may be produced by integrating the curable granular composition obtained by the aforementioned method with a uniaxial or biaxial continuous kneading machine at low temperature, and then making it to a prescribed thickness through two rolls or the like.

[Use as Laminates and Film Adhesives]

The composition can be used in sheet form, in particular as a laminate body, having a structure including a sheet-like member comprising the above curable granular silicone composition between two film-like substrates provided with a release layer.

Although there are no restrictions on how to manufacture such a peelable laminate, cured silicone sheets with hot-melt properties can be produced using organopolysiloxane resin microparticles as the raw material, and a manufacturing process comprising:

Step 1: A step of mixing organopolysiloxane resin microparticles, a curing agent, and a functional filler;

Step 2: A step of kneading the mixture obtained in step 1 while heating and melting at a temperature of 120° C. or lower;

Step 3: A step wherein the mixture after heating and melting and mixing obtained in Step 2 is laminated between two films, each having at least one release surface, to form a laminate body; and Step 4: A step of stretching the mixture in the laminate body obtained in Step 3 between rolls to form a curable hot melt silicone sheet having a specific film thickness.

For example, Step 3 and Step 4 can be continuous and integrated, for example, the mixture after heating and melting obtained in Step 2 is laminated by being discharged or applied between the films having at least one release surface directly under the rolls, and at the same time, the film may be stretched and molded to a specific thickness by adjusting the gap between the rolls. Thus, a manufacturing method having a process in which Step 3 and Step 4 are substantially integrated is also included within the scope of the above manufacturing method.

In other words, Steps 3 and 4 may be carried out in a continuous and integrated manner, for example, a process in which the mixture obtained in Step 2 is discharged or applied between two release films to sandwich the aforementioned mixture between the two release films, such as between two long release films, and a process in which a laminated body comprising the two release films and the aforementioned mixture interposed therebetween is continuously passed between rolls to stretch and form the mixture between the release films to obtain a desired laminated body. Such a method in which Step 3 and Step 4 are performed in an integrated manner is also included in the above-described manufacturing method.

In addition, in Step 3 described above, the process of laminating the mixture after heating and melting between the films is not particularly limited, and may be a process in which (i) the mixture after heating and melting from Step 2 is discharged or applied onto the first release film having a release surface, and then the second release film is brought into contact with the surface of the mixture opposite to the surface in contact with the first release film, and the mixture after heating and melting is interposed, or in other words sandwiched, between the first and second release films, or (ii) by discharging or applying the mixture after heating and melting from Step 2 between the first release film and the second release film having a release surface, the mixture after heating and melting is interposed between the two release films. An example of (ii) is bringing the first and second release films into close proximity by suitable means, such as two rolls, and discharging or applying the mixture from Step 2 at the point where the two release films are brought into close proximity, thereby sandwiching the mixture in the gap between the two release films at the same time or approximately at the same time. Steps 3 and 4 described above are preferably continuous processes.

The type of the film substrate is not particularly limited, and polyester film, polyolefin film, polycarbonate film, acrylic film, and the like can be used as appropriate. The sheet-like substrate is preferably non-porous.

The release layer is necessary for easily peeling off the sheet-like material consisting of the curable granular silicone composition from the film-like substrate, and is sometimes called a release liner, separator, release layer, or release coating layer. Suitably, the release layer can be a silicone release agent, a fluorine release agent, an alkyd release agent, a release layer with a release coating function such as a fluorosilicone release agent and the like, or a substrate in and of itself that is difficult for the adhesive material layer to adhere to, made up of the curing-reactive silicone adhesive composition of the present invention or the cured product thereof. In particular, in the laminated body of the present invention, a release layer obtained by curing a fluorosilicone based release agent is preferably used as the release layer.

The laminate described above can be used, for example, by peeling off the sheet-like member in an uncured state from the film-like substrate after applying the sheet-like member made up of the curable granular silicone composition to the adherend.

Here, the sheet-like member made up of the curable granular silicone composition has a thickness of 1 mm or less and may be a film-like adhesive. In other words, the laminate body may and preferably includes a peelable film adhesive retained by a substrate film. Since the film adhesive has hot melt properties, it may be used as an adhesive for temporary fixing of semiconductor components, and the like, and may be used as a die attach film.

The sheet-like member made up of the curable granular silicone composition may be molded together with the substrate by compression molding or press molding as-is. Here, the molding may be performed leaving the film-like substrate on one side, and the film may be used as a release film to prevent adhesion to the mold during molding.

The composition is non-fluid at 25° C. Here, the term "non-fluid" means that it is not deformed or flowed in a no-load condition, and it is preferable that it is not deformed or flowed in a no-load condition at 25° C. when it is molded into a pellet, a tablet, or the like. Such non-fluid can be evaluated, for example, by placing a molded product of the composition on a hot plate at 25° C. and substantially not deforming or flowing under no load or constant weight. This is because, when non-fluid at 25° C., shape retention at this temperature is good and the surface tackiness is low.

The softening point of the composition is preferably 100° C. or less. Such a softening point means a temperature at which the deformation amount in the height direction is 1 mm or more when the deformation amount of the composition is measured after the load is removed by continuing to press the hot plate with a load of 100 grams for 10 seconds from above.

The present composition tends to decrease in viscosity rapidly under high temperature and high pressure (that is, in the molding step), and a value measured at a similar high temperature and high pressure is preferably used as a useful melt viscosity value. Therefore, the melt viscosity of the present invention is more preferably measured under high pressure using a Koka-type flow tester (manufactured by the Shimadzu Corporation) than when measured with a rotational viscometer such as a rheometer. Specifically, the present composition should have a melt viscosity at 150° C. of 200 Pa-s or less, and more preferably 150 or less. This is because the adhesiveness to the base material after the composition is hot-melted and then cooled to 25° C. is good.

The composition has excellent curing characteristics. The curing characteristics of the composition can be evaluated using a rheometer. The curing characteristics of the present composition can be evaluated based on the values of Ti and T90 for the times (seconds) at which the 1% torque value and the 90% torque value are obtained, respectively, when the torque value after 3 minutes at a constant temperature of 150 to 180° C. is set to 100. The present composition preferably has the Ti of 20 seconds or more, or 25 seconds or more, as measured at a constant temperature of 150 to 180° C. In addition, the composition preferably has the T90 of 145 seconds or less, or 140 seconds or less, as measured at a temperature of 150 to 180° C. The rheometer used for the measurements is exemplified by a rheometer MDR2000 (manufactured by Alpha Technologies, Inc.).

[Method of Producing Curable Particulate Silicone Composition]

The present composition can be produced by powder-mixing components (A) to (C) and other optional components at a temperature lower than the softening point of component (A). The powder mixer used in the present manufacturing method is not limited, and examples include a uniaxial or biaxial continuous mixer, a two-roll mixer, a ROSS mixer, a Hobart mixer, a dental mixer, a planetary mixer, a kneader mixer, a laboratory mill, a small grinder, and a henschel mixer, and preferably, a laboratory mill, a small grinder, or a henschel mixer.

[Method of Molding Cured Product]

The composition can be cured by a method comprising at least the following steps (I) to (III).

(I) a step of heating to a temperature of 50° C. or higher to melt the present composition; and (II) a step of injecting the curable silicone composition obtained in step (I) into a mold or a step of distributing the curable silicone composition obtained in step (I) to a mold by clamping; and (III) a step of curing the curable silicone composition injected in step (II).

As described above, the composition excels in gap-filling properties while melted and flexibility of the cured product at room temperature to high temperature, and therefore, the cured product can be very suitably used in a molding method including a coating process in which overmolding and underfilling of a semiconductor device are performed at the same time (so-called mold underfilling method). Furthermore, due to the characteristics described above, the composition can be suitably used in a molding method including a coating process (so-called wafer molding) in which the surface of a semiconductor wafer substrate on which a single or a plurality of semiconductor devices are mounted is covered and overmolded so that the gaps between the semiconductor devices are filled with the cured product.

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding. In particular, a sheet obtained by molding the composition of the present invention is useful as a material for compression molding.

Finally, in step (III), the curable silicone composition injected (applied) in step (II) is cured. When an organic peroxide is used as component (C), the heating temperature is preferably 150° C. or higher or 170° C. or higher.

Since it is suitable as a protective member for a semiconductor or the like, the cured product obtained by curing the present composition preferably has a type-D durometer hardness of 20 or more at 25° C. This type-D durometer hardness is determined by the type-D durometer in accordance with the JIS K 6253-1997 "Hardness Testing Methods for Vulcanized Rubber and Thermoplastic Rubber".

Furthermore, since it is suitable as an encapsulant for semiconductors in flexible applications requiring flexibility, the flexural elongation of the cured product measured by the method specified in JIS K 6911-1995 "General Test Method for Thermosetting Plastics" should be 2% or more, or preferably 4% or more.

[Use of Composition]

The present composition has hot melt properties, gap filling properties while melted (hot-melt), and has superior workability and curability, and is therefore preferable as an encapsulant or underfill agent for semiconductors; encapsulant or underfill agent for power semiconductors such as SiC, GaN, and the like; encapsulant or light reflecting material for optical semiconductors such as light emitting diodes, photodiodes, phototransistors, laser diodes, and the like; electrical and electronic adhesive, potting agent, protecting agent, and coating agent. Since the composition has hot-melt properties, it is also suitable as a material for transfer molding, compression molding, or injection molding. In particular, it is suitable for use as an encapsulant for semiconductors that use the mold underfill method or the wafer molding method during molding. Furthermore, a sheet of this composition can be used as a curable film adhesive or as a buffer layer for stress between two substrates with different coefficients of linear expansion.

[Use of Cured Product]

Although the applications of the cured product of the present invention are not particularly limited, the composition of the present invention has hot-melt properties, superior moldability and gap-fill properties, and the cured product has the flexibility described above at room temperature, high stress relief properties, and flexural elongation. Therefore, the cured product obtained by curing the present composition can be suitably used as a member for a semiconductor device, and can be suitably used as an encapsulant for a semiconductor element, an IC chip or the like, a light reflection material for an optical semiconductor device, and as an adhesive/bonding member of a conductor device.

The semiconductor device equipped with a member made up of the cured product of the present invention is not particularly limited, but is particularly preferred to be a power semiconductor device, an optical semiconductor device, or a semiconductor device mounted on a flexible circuit base.

In addition, the curable granular silicone composition of the present invention, especially the curable granular silicone composition in pellet or sheet form, can be used for large-area encapsulation of semiconductor substrates (including wafers). Furthermore, a sheet formed from the curable granular silicone composition of the present invention can be used for die attach films, sealing flexible devices, stress relief layers for bonding two different substrates, and the like.

EXAMPLES

The hot-melt curable silicone composition of the present invention and manufacturing method thereof are described in detail by means of examples and comparative examples. Note that in the formulas, Me, Ph, and Vi represent a methyl group, a phenyl group, and a vinyl group, respectively. The softening points of the curable silicone compositions of each example and comparative example were measured by the following methods. The curable silicone composition was heated at 150° C. for 2 hours to produce a cured product, and the storage modulus, loss tangent (tan δ), and warpage of the molded product were measured by the following methods. The results are shown in Table 1.

[Softening Point of Curable Particulate Silicone Composition]

The curable particulate silicone composition was molded into cylindrical pellets of φ14 mm*22 mm. The pellet was placed on a hot plate set at 25° C. to 100° C. and kept pressed from above for 10 seconds with a load of 100 grams, and after the load was removed, the amount of deformation of the pellet was measured. The temperature at which the deformation amount in the height direction was 1 mm or more was defined as the softening point.

[Storage Elastic Modulus and Tan δ of Cured Product]

The curable silicone composition was heated at 150° C. for 2 hours to prepare a cured product. The storage modulus and loss modulus of the cured product from −50° C. to 250° C. were measured using a rheometer ARES (manufactured by T.A. Instruments Japan Co., Ltd.), and the values at 25° C. and 150° C. of the storage modulus, and the peak temperature and peak value of the tan δ (storage modulus/loss modulus) were captured. The results are shown in Table 1.

[Warpage of Molded Products]

The cured silicone composition was integrally molded on an aluminum plate with a size of 60 mm×60 mm×0.4 mm by heating at 150° C. for 2 hours using a heat press with a size of 60 mm×60 mm×0.6 mm. To make the warping behavior easier to understand, a substrate (thin aluminum plate) that easily warps was used for the evaluation. One side of the obtained molded product was fixed to a horizontal desk with tape, and the lift distance of the other side from the desk was measured using a ruler to determine the warpage value of the molded product.

Organopolysiloxane resins or organopolysiloxane crosslinked products containing a hydrosilylation reaction catalyst were prepared by the methods shown in Reference Examples 1 to 6 below, and their hot melt properties were evaluated by the presence or absence of softening point/melt viscosity. The organopolysiloxane resin microparticles were also prepared by the method shown in Reference Examples 3 to 6. In the reference examples, the 1,1,3,3-tetramethyl-1,3-divinyl disiloxane used for the platinum complex that is the hydrosilylation reaction catalyst is described as "1,3-divinyltetramethyldisiloxane".

Reference Example 1

A toluene solution of a resinoid organopolysiloxane (1) containing 10 ppm of platinum metal in mass units was prepared by charging 270.5 g of a 55 mass % toluene solution of a resinous organopolysiloxane represented by the average unit formula: $(PhSiO_{3/2})_{0.80}(Me_2ViSiO_{1/2})_{0.20}$, which is a white solid at 25° C., 21.3 g of a diphenylsiloxane capped at both molecular terminals with dimethylhydrogensiloxy groups and having a viscosity of 5 mPa·s (silicon-bonded hydrogen atom content=0.6 mass %) represented by the formula: $HMe_2SiO(Ph_2SiO)SiMe_2H$, (in an amount such that the amount of silicon-bonded hydrogen atoms in this component is 0.5 mol relative to 1 mol of vinyl groups in the resinoid organopolysiloxane), and 0.43 g of a 1,3-divinyltetramethyldisiloxane solution of platinum 1,3-divinyltetramethyldisiloxane complex (platinum metal content=approximately 4,000 ppm) (in an amount such that the amount of platinum metal is 10 ppm in mass units with respect to this liquid mixture) into a 1 L flask and stirring uniformly at room temperature.

Thereafter, the temperature in the flask was raised to 100° C. by an oil bath, and the mixture was stirred under a reflux of toluene for 2 hours to prepare a toluene solution of an organosiloxane crosslinked product (1) containing a resinoid organosiloxane derived from the above-mentioned resinoid organopolysiloxane and a chain organosiloxane derived from the above-mentioned diphenylsiloxane and having a vinyl group not involved in the above-mentioned reaction. When the organosiloxane crosslinked product (1) was analyzed by FT-IR, peaks of silicon-bonded hydrogen atom were not observed. In addition, the softening point of this organosiloxane crosslinked product (1) was 75° C., and the melt viscosity thereof at 100° C. was 700 Pa·s.

Reference Example 2

270.5 g of an Organopolysiloxane 55 mass % xylene solution; 0.375 g platinum 1,3-divinyltetramethyldisiloxane complex 1,3-divinyltetramethyldisiloxane solution (platinum metal content=approximately 4,000 ppm) expressed by the average unit formula: $(Me_2ViSiO_{1/2})_{0.05}(Me_3SiO_{1/2})_{0.39}(SiO_{4/2})_{0.56}(HO_{1/2})_{0.02}$ was introduced into a 1 L flask in white solid form at 25° C. and was uniformly stirred at room temperature (25° C.) to prepare an organopolysiloxane resin (2) xylene solution containing 10 ppm in terms of mass units as platinum metal.

In addition, the organopolysiloxane resin (2) did not soften/melt even when heated to 200° C. and did not have hot-melt properties.

Reference Example 3

270. 5 g of an organopolysiloxane 55 mass % xylene solution; and 0.375 g of platinum 1,3-divinyltetramethyldisiloxane complex 1,3-divinyltetramethyldisiloxane solution (platinum metal content=approximately 4,000 ppm) 0.375 g expressed by the average unit formula: $(Me_3SiO_{1/2})_{0.44}$ $(SiO_{4/2})_{0.56}(HO_{1/2})_{0.02}$ was introduced into a 1 L flask in white solid form at 25° C. and was uniformly stirred at room temperature (25° C.) to prepare an organopolysiloxane resin (3) xylene solution containing 10 ppm in terms of mass units as platinum metal.
In addition, the organopolysiloxane resin (3) did not soften/melt even when heated to 200° C. and did not have hot-melt properties.

Reference Example 4: Hot-Meltable Organopolysiloxane Resin Microparticles (1)

True-spherical hot-melt silicone microparticles (1) were prepared by atomizing the toluene solution of the organosiloxane crosslinked product (1) prepared in Reference Example 1 by spray drying at 40° C. while removing toluene. Observation of the fine particles with an optical microscope revealed that the particle diameter was 5 to 10 μm and the average particle diameter was 7.5 μm.

Reference Example 5: Hot-Meltable Organopolysiloxane Resin Microparticles (2)

A xylene solution of the organopolysiloxane resin (2) prepared in Reference Example 1 was converted into particles while removing the xylene by a spray method using a spray dryer at 50° C. Thus, spherical, non-hot melt organopolysiloxane resin microparticles (2) were prepared. Observation of the microparticles with an optical microscope revealed that the particle diameter was 5 to 10 μm and the average particle diameter was 6.9 μm.

Reference Example 6: Hot-Melt Organopolysiloxane Resin Microparticles (3)

A xylene solution of the organopolysiloxane resin (3) prepared in Reference Example 2 was converted into particles while removing the xylene by a spray method using a spray dryer at 50° C. Thus, spherical, non-hot melt organopolysiloxane resin microparticles (3) were prepared. Observation of the microparticles with an optical microscope revealed that the particle diameter was 5 to 10 μm and the average particle diameter was 7.4 μm.

Example 1

73.1 g of hot-melt silicone microparticles (1), 9.5 g of diphenylsiloxane capped at both molecular terminals with dimethylhydrogensiloxy groups with a viscosity of 5 mPa-s represented by the formula: $HMe_2SlO(Ph_2SiO)SiMe_2H$ (content of silicon-bonded hydrogen atoms=0.6 mass %), 17.4 g of methylphenylpolysiloxane capped at both molecular terminals with dimethylvinylsiloxy groups which has a viscosity of 1,000 mPa·s represented by the average formula $Me_2ViSiO(MePhSiO)_{17.5}SiMe_2Vi$ (vinyl group content=2.1 mass %), {an amount such that the silicon-bonded hydrogen atoms in the diphenylsiloxane is 0.9 mol relative to 1.0 mol of vinyl groups in the silicone microparticles (1) and the methylphenylpolysiloxane capped at both molecular terminals with dimethylvinylsiloxy groups},
1-ethynyl-1-cyclohexanol (amount to be 300 ppm in mass units for this composition),
24.0 g of fused silica with an average particle diameter of 2.5 μm (SP60 manufactured by Nippon Steel Materials Micron), and
30.0 g of fumed silica (AEROSIL 50 from Japan Aerosil) having an average particle diameter of 0.04 μm,
were all together introduced into a small grinder, and stirring was performed for 1 minute at room temperature (25° C.) to prepare a uniform curable granular silicone composition. The measurement results of the softening point and other properties of this composition are shown in Table 1.

Example 2

89.3 g of hot-melt silicone microparticles (1),
10.7 g of diphenylsiloxane capped at both molecular terminals with dimethylhydrogensiloxy groups with a viscosity of 5 mPa-s represented by the formula: $HMe_2SlO(Ph_2SiO)SiMe_2H$ (content of silicon-bonded hydrogen atoms=0.6 mass %)
{an amount such that the silicon-bonded hydrogen atoms in the diphenylsiloxane is 0.9 mol relative to 1.0 mol of vinyl groups in the silicone microparticles (1)},
1-ethynyl-1-cyclohexanol (amount to be 300 ppm in mass units for this composition),
98.0 g of titanium dioxide (SX-3103 manufactured by Sakai Chemical Industry Co., Ltd.) having an average particle diameter of 0.5 μm,
4.0 g of fumed silica (AEROSIL 50 from Japan Aerosil) having an average particle diameter of 0.04 μm,
were all together introduced into a small grinder, and stirring was performed for 1 minute at room temperature (25° C.) to prepare a uniform curable granular silicone composition. The measurement results of the softening point and other properties of this composition are shown in Table 1.

Example 3

(a+c(pt)) 58.5 g of non-hot meltable organopolysiloxane resin microparticles (3) (vinyl group content=0 mass %),
(a+c(pt)) 10.3 g of non-hot meltable organopolysiloxane resin microparticles (2) (vinyl group content=1.91 mass %),
(b1) 29.5 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %),
(c4(SiH)) 1.57 g of organohydrogenpolysiloxane represented b the formula: $Me_3SiO(MeHSiO)_7(Me_2SiO)_{6.5}SiMe_3$
{an amount such that the silicon-bonded hydrogen atom in the organohydrogenpolysiloxane resin is 1.3 mol relative to 1 mol of vinyl groups in the organopolysiloxane resin microparticle granules (2) and dimethylpolysiloxane capped at both molecular terminals with dimethylvinylsiloxy groups}, (d1) 203.1 g of alumina (AES-12 from Sumitomo Chemicals) with an average particle diameter of 0.44 μm, and 1-ethynyl-1-cyclohexanol (an amount of 1,000 ppm in mass units relative to this composition) was batch fed into a small grinder and stirred for 1 minute at room temperature (25° C.) to prepare a uniform curable granular silicone composition. The measurement results of the softening point and other properties of this composition are shown in Table 1.

Example 4

(a+c(pt)) 55.3 g of non-hot meltable organopolysiloxane resin microparticles (3) (vinyl group content=0 mass %), (a+c(pt)) 13.8 g of non-hot meltable organopolysiloxane resin microparticles (2) (vinyl group content=1.91 mass %), (b1) 29.6 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %), (c2(SiH)) 1.1 g of organohydrogenpolysiloxane resin represented by the formula: $(HMe_2SiO_{1/2})_{0.67}(SiO_{4/2})_{0.33}$ (silicon-bonded hydrogen atom content=0.95 mass %) {an amount such that the silicon-bonded hydrogen atom in the organohydrogenpolysiloxane resin is 1.1 mol relative to 1 mol of vinyl groups in the organopolysiloxane resin microparticle granules (2) and dimethylpolysiloxane capped at both molecular terminals with dimethylvinylsiloxy groups}, (d1) 232.6 g of alumina (AES-12 from Sumitomo Chemicals) having an average particle diameter of 0.44 μm, and 1-ethynyl-1-cyclohexanol (an amount of 1,000 ppm in mass units relative to this composition) was batch fed into a small grinder and stirred for 1 minute at room temperature (25° C.) to prepare a uniform curable granular silicone composition. The measurement results of the softening point and other properties of this composition are shown in Table 1.

Comparative Example 1

89.3 g of hot-melt silicone microparticles (1), 10.7 g of diphenylsiloxane capped at both molecular terminals with dimethylhydrogensiloxy groups with a viscosity of 5 mPa-s represented by the formula: $HMe_2SlO(Ph_2SiO)SiMe_2H$ (content of silicon-bonded hydrogen atoms=0.6 mass %)

{an amount such that the silicon-bonded hydrogen atoms in the diphenylsiloxane is 0.9 mol relative to 1.0 mol of vinyl groups in the silicone microparticles (1)}, 1-ethynyl-1-cyclohexanol (amount to be 300 ppm in mass units for this composition), 298.5 g of titanium dioxide (SX-3103 manufactured by Sakai Chemical Industry Co., Ltd.) having an average particle diameter of 0.5 μm, 1.5 g of fumed silica (AEROSIL 50 from Japan Aerosil) having an average particle diameter of 0.04 μm, were all together introduced into a small grinder, and stirring was performed for 1 minute at room temperature (25° C.) to prepare a uniform curable granular silicone composition. The measurement results of the softening point and other properties of this composition are shown in Table 1.

Comparative Example 2

89.3 g of hot-melt silicone microparticles (1), 10.7 g of diphenylsiloxane capped at both molecular terminals with dimethylhydrogensiloxy groups with a viscosity of 5 mPa-s represented by the formula: $HMe_2SlO(Ph_2SiO)SiMe_2H$ (content of silicon-bonded hydrogen atoms=0.6 mass %)

{an amount such that the silicon-bonded hydrogen atoms in the diphenylsiloxane is 0.9 mol relative to 1.0 mol of vinyl groups in the silicone microparticles (1)}, 1-ethynyl-1-cyclohexanol (amount to be 300 ppm in mass units for this composition), 235.0 g of fused silica with an average particle diameter of 2.5 μm (SP60 manufactured by Nippon Steel Materials Micron), were all together introduced into a small grinder, and stirring was performed for 1 minute at room temperature (25° C.) to prepare a uniform curable granular silicone composition. The measurement results of the softening point and other properties of this composition are shown in Table 1.

Comparative Example 3

89.3 g of hot-melt silicone microparticles (1), 7.4 g of diphenylsiloxane capped at both molecular terminals with dimethylhydrogensiloxy groups with a viscosity of 5 mPa-s represented by the formula: $HMe_2SlO(Ph_2SiO)SiMe_2H$ (content of silicon-bonded hydrogen atoms=0.6 mass %)

3.1 g of branched chain organopolysiloxane with at least 2 or more silicon-bonded hydrogen atoms in the molecule having a viscosity of 25 mPa-s represented by the average unit formula: $(PhSiO_{3/2})_{0.4}(HMe_2SiO_{1/2})_{0.6}$ (content of silicon-bonded hydrogen atoms=0.65 mass %)

{an amount such that the silicon-bonded hydrogen atoms in the diphenylsiloxane and branched chain organopolysiloxane is 0.9 mol relative to 1.0 mol of vinyl groups in the silicone microparticles (1)}, 1-ethynyl-1-cyclohexanol (amount to be 300 ppm in mass units for this composition), 232.0 g of titanium dioxide (SX-3103 manufactured by Sakai Chemical Industry Co., Ltd.) having an average particle diameter of 0.5 μm, 1.5 g of fumed silica (AEROSIL 50 from Japan Aerosil) having an average particle diameter of 0.04 μm, were all together introduced into a small grinder, and stirring was performed for 1 minute at room temperature (25° C.) to prepare a uniform curable granular silicone composition. The measurement results of the softening point and other properties of this composition are shown in Table 1.

Comparative Example 4

45.0 g of hot-melt silicone microparticles (1), 47.6 g of methylphenylpolysiloxane capped at both molecular terminals with dimethylvinylsiloxy groups which has a viscosity of 20,000 mPa-s represented by the average formula $Me_2ViSiO(MePhSiO)_{92}SiMe_2Vi$ (vinyl group content=0.63 mass %), 1.0 g of diphenylsiloxane capped at both molecular terminals with dimethylhydrogensiloxy groups with a viscosity of 5 mPa-s represented by the formula: $HMe_2SiO(Ph_2SiO)SiMe_2H$ (content of silicon-bonded hydrogen atoms=0.6 mass %)

6.3 g of branched chain organopolysiloxane with at least 2 or more silicon-bonded hydrogen atoms in the molecule having a viscosity of 25 mPa-s represented by the average unit formula: $(PhSiO_{3/2})_{0.4}(HMe_2SiO_{1/2})_{0.6}$ (content of silicon-bonded hydrogen atoms=0.65 mass %)

{an amount such that the silicon-bonded hydrogen atoms in the diphenylsiloxane and branched chain organopolysiloxane is 0.9 mol relative to 1.0 mol of vinyl groups in the silicone microparticles (1)}, 1-ethynyl-1-cyclohexanol (amount to be 300 ppm in mass units for this composition), 98.0 g of titanium dioxide (SX-3103 manufactured by Sakai Chemical Industry Co., Ltd.) having an average particle diameter of 0.5 μm, 4.0 g of fumed silica (AEROSIL 50 from Japan Aerosil) having an average particle diameter of 0.04 μm, were all together introduced into a small grinder, and stirring was performed for 1 minute at room temperature (25° C.) to prepare a uniform curable granular silicone composition. The measurement results of the softening point and other properties of this composition are shown in Table 1.

Comparative Example 5

(a+c(pt)) 34.1 g of non-hot meltable organopolysiloxane resin microparticles (2) (vinyl group content=0 mass %), (a+c(pt)) 34.1 g of non-hot meltable organopolysiloxane resin microparticles (1) (vinyl group content=1.91 mass %), (b2) 14.5 g of dimethylpolysiloxane capped at both molecular terminals with dimethylvinylsiloxy groups represented by the formula: $ViMe_2SiO(Me_2SiO)_{140}Si-ViMe_2$ (vinyl group content=0.44 mass %), (b3) 14.5 g of dimethylpolysiloxane capped at both molecular terminals with dimethylvinylsiloxy groups represented by the formula: $ViMe_2SiO(Me_2SiO)_{300}Si-ViMe_2$ (vinyl group content=0.21 mass %), (c2(SiH)) 2.85 g of organohydrogenpolysiloxane resin represented by the formula: $(HMe_2SiO_{1/2})_{0.67}(SiO_{4/2})_{0.33}$ (silicon-bonded hydrogen atom content=0.95 mass %) {an amount such that the silicon-bonded hydrogen atom in the organohydrogenpolysiloxane resin is 1.1 mol relative to 1 mol of vinyl groups in the organopolysiloxane resin microparticle granules (1) and dimethylpolysiloxane capped at both molecular terminals with dimethylvinylsiloxy groups}, (d2) 142.6 g of titanium dioxide (SX-3103 manufactured by Sakai Chemical Industry Co., Ltd.) having an average particle diameter of 0.5 μm, (d3) 10.3 g of fumed silica (AEROSIL 50 from Japan Aerosil) having an average particle diameter of 0.04 μm, and 1-ethynyl-1-cyclohexanol (amount to be 1,000 ppm in mass units for this composition), were all together introduced into a small grinder, and stirring was performed for 1 minute at room temperature (25° C.) to prepare a uniform curable granular silicone composition. The measurement results of the softening point and other properties of this composition are shown in Table 1.

Comparative Example 6

(a+c(pt)) 41.3 g of non-hot meltable organopolysiloxane resin microparticles (2) (vinyl group content=0 mass %), (a+c(pt)) 27.5 g of non-hot meltable organopolysiloxane resin microparticles (1) (vinyl group content=1.91 mass %), (b4) 27.5 g of dimethylpolysiloxane capped at both molecular terminals with dimethylvinylsiloxy groups represented by the formula: $ViMe_2SiO(Me_2SiO)_{45}Si-ViMe_2$ (vinyl group content=1.53 mass %), (c2(SiH)) 3.68 g of organohydrogenpolysiloxane resin represented by the formula: $(HMe_2SiO_{1/2})_{0.67}(SiO_{4/2})_{0.33}$ (silicon-bonded hydrogen atom content=0.95 mass %) {an amount such that the silicon-bonded hydrogen atoms in the organohydrogenpolysiloxane resin is 1.0 mol relative to 1 mol of vinyl groups in the organopolysiloxane resin microparticle granules (1) and dimethylpolysiloxane capped at both molecular terminals with dimethylvinylsiloxy groups}, (d2) 299.0 g of titanium dioxide (SX-3103 manufactured by Sakai Chemical Industry Co., Ltd.) having an average particle diameter of 0.5 μm, (d3) 1.5 g of fumed silica (AEROSIL 50 from Japan Aerosil) having an average particle diameter of 0.04 μm, and 1-ethynyl-1-cyclohexanol (an amount of 1,000 ppm in mass units relative to this composition was batch fed into a small grinder and stirred for 1 minute at room temperature (25° C.) to prepare a uniform white curable granular silicone composition. The measurement results of the softening point and other properties of this composition are shown in Table 1.

| | Example 1 | Example 2 | Example 3 | Example 4 | Comparative Example 1 |
|---|---|---|---|---|---|
| Properties of curable liquid silicone composition Softening point (° C.) | 60 | 60 | 80 | 80 | 75 |
| Properties of Cured Product Storage elastic modulus 25° C. [MPa] | 240 | 390 | 120 | 145 | 1,790 |
| Storage elastic modulus 150° C. [MPa] | 2 | 7 | 5 | 3 | 85 |
| tanδ peak value | 0.55 | 0.62 | 0.57 | 0.67 | 0.28 |
| tanδ peak temperature [° C.] | 50 | 66 | 94 | 131 | 65 |
| Warpage of Molded Product [mm] | 0 | 0 | 0 | 0 | 5 |

| | Comparative Example 2 | Comparative Example 3 | Comparative Example 4 | Comparative Example 5 | Comparative Example 6 |
|---|---|---|---|---|---|
| Properties of curable liquid silicone composition Softening point (° C.) | 80 | 75 | 65 | 90 | 100 |
| Properties of Cured Product Storage elastic modulus 25° C. [MPa] | 2,400 | 1,650 | 195 | 90 | 520 |
| Storage elastic modulus 150° C. [MPa] | 19 | 164 | 12 | 8 | 95 |
| tanδ peak value | 0.50 | 0.42 | 0.28 | 0.38 | 0.32 |
| tanδ peak temperature [° C.] | 66 | 72 | 0 | 140 | 140 |
| Warpage of Molded Product [mm] | 3 | 4 | 3 | 1 | 3 |

[Summary]

The curable granular silicone compositions of Examples 1 to 4 of the present invention have favorable hot melt properties. Furthermore, the storage modulus of the cured product at 25° C. and 150° C. satisfies the requirements of the present invention, and the peak value of tan δ expressed by the storage modulus/loss modulus (G'/G") is sufficiently high. Therefore, no warpage or breakage of the molded product occurred even in an integrated molding using a warp-prone aluminum plate. Thus, the cured products obtained using these curable granular silicone compositions have superior stress relief properties and are expected to be suitable for thin layer encapsulation of semiconductors and large area batch encapsulation processes of semiconductors.

On the other hand, in Comparative Examples 1 to 6, which do not satisfy the requirements for the composition of the present invention or the requirements for the storage modulus and the peak value of tan δ at 25° C. and 150° C., warpage of the molded product occurred more than 1 mm in the integrated molding using an aluminum plate, and sufficient stress relief properties could not be realized in the cured product.

Manufacturing Example 1

The granular curable silicone composition, such as Example 1 above, was heated to 80° C., heated and melted using a twin-screw extruder, and kneaded in the form of a semi-solid softened material, and then fed onto a release film (FL2-01 manufactured by Takara Inc.) at a feed rate of 5 kg/hour and laminated between the two release films. The laminate body was then stretched between rolls to form a laminate body in which a hot-melt curable silicone sheet having a thickness of 500 μm is laminated between two peelable films, and the entire laminate body was cooled by a cooling roll set at −15° C. In said laminate body, a flat and homogeneous hot-meltable curable silicone sheet was obtained by separating the peelable film.

Manufacturing Example 2

The granular curable silicone compositions of Example 1 and the like described above were heated to 80° C., melted and kneaded using a twin-screw extruder, and formed into a sheet shape using a T-type die (opening dimensions: 800 μm×100 mm, heated to 80° C.), and then fed onto a peelable film (FL2-01 manufactured by Takara Inc.) at a supply speed of 5 kg/hr. The entire sheet was cooled by a cooling roll set at −15° C., and then laminated between the two release films. The laminate body was then stretched between rolls to form a laminate body in which a hot-melt curable silicone sheet having a thickness of 500 μm is laminated between two peelable films. In said laminate body, a flat and homogeneous hot-meltable curable silicone sheet was obtained by separating the peelable film.

The invention claimed is:

1. A curable granular silicone composition, comprising
(A) organopolysiloxane resin microparticles having a curing reactive functional group;
(B) a functional inorganic filler; and
(C) a curing agent;
wherein the curable granular silicone composition provides a cured product thereof where the value of the storage elastic modulus (G') at 25° C. is 2,000 MPa or less,
the value of the storage elastic modulus (G') at 150° C. is 100 MPa or less, and
the peak value of the loss tangent (tan δ) of the cured product, which is expressed by the storage elastic modulus/loss elastic modulus (G'/G") at a frequency of 1.0 Hz, is 0.40 or more; and
wherein component (A) comprises a mixture of:
(A2-1) an organopolysiloxane resin microparticle having a softening point of 200° C. or higher and no hot-melt properties as a whole molecule, having at least one curing reactive functional group containing a carbon-carbon double bond in the molecule, and where 20 mol % or more of the total siloxane units of the organopolysiloxane resin microparticle is siloxane units represented by $SiO_{4/2}$; and
(A2-2) a straight- or branched-chain organopolysiloxane, liquid at 25° C., having at least two curing reactive functional groups containing a carbon-carbon double bond in the molecule.

2. The curable granular silicone composition according to claim 1, wherein component (B) is a functionally inorganic filler that is one or more types selected from the group consisting of a reinforcing filler, a white pigment, a thermal conductive filler, an electrically conductive filler, and an organic filler.

3. The curable granular silicone composition according to claim 1, wherein component (A) further comprises (A1) a hot-meltable organopolysiloxane resin microparticle having a softening point of 30° C. or higher and having at least one curing reactive functional group containing a carbon-carbon double bond in the molecule.

4. The curable granular silicone composition according to claim 3, wherein at least some or all of component (A1) is:
(A1-1) a hot-meltable organopolysiloxane resin microparticle with a regular spherical shape and a softening point of 30° C. or higher, having at least one curing reactive functional group containing a carbon-carbon double bond in the molecule, and at least 10 mol % of the silicon-bonded organic groups are aryl groups, and the average primary particle diameter thereof is 1 to 10 μm.

5. The curable granular silicone composition according to claim 3, wherein at least some or all of component (A1) is:
(A1-2) a hot-meltable organopolysiloxane resin microparticle with a softening point of 30° C. or higher, having at least one curing reactive functional group containing a carbon-carbon double bond in the molecule, comprising:
($A_1$) a resinoid organosiloxane,
($A_2$) an organopolysiloxane crosslinked product comprising at least one partially crosslinked organopolysiloxane,
($A_3$) a block copolymer comprising a resinoid organosiloxane and chain-like organosiloxane blocks,
or a mixture of at least two of these.

6. The curable granular silicone composition according to claim 1, wherein at least some or all of component (A) is a mixture of component (A2-1) and component (A2-2), and where component (A2-1) is organopolysiloxane resin microparticles selected from:
(A2-1-1) organopolysiloxane resin microparticles having no hot-melt properties as a whole molecule, having no curing reactive functional group containing carbon-carbon double bonds in the molecule, and where 20 mol % or more of the total siloxane units of the organopolysiloxane resin microparticles is siloxane units represented by $SiO_{4/2}$, and an organopolysiloxane resin microparticle mixture having no hot-melt properties as a whole molecule, having at least one curing reactive functional group containing a carbon-carbon double bond in the molecule, and where 20 mol % or more of the total siloxane units of the organopolysiloxane resin microparticle mixture is siloxane units represented by $SiO_{4/2}$.

7. The curable granular silicone composition according to claim 6, wherein at least some or all of component (A) is a mixture of component (A2-1) and component (A2-2), and where component (A2-2) is:
(A2-2-1) a straight-chain organopolysiloxane represented by the following structural formula:

$$R^4{}_3SiO(SiR^4{}_2O)_kSiR^4{}_3$$

where each $R^4$ is independently a monovalent hydrocarbon group having 1 to 10 carbon atoms, except that at least two of the $R^4$ in one molecule are alkenyl groups, and k is a number from 20 to 5,000.

8. The curable granular silicone composition according to claim 1, wherein at least some or all of component (A) is a mixture comprising:
(A2-1-1) 100 parts by mass of organopolysiloxane resin microparticles having no hot-melt properties as a whole molecule, having no curing reactive functional group containing a carbon-carbon double bond in the molecule, and where 20 mol % or more of the total siloxane units of the organopolysiloxane resin microparticles is siloxane units represented by $SiO_{4/2}$,
(A2-1-2) 3 to 50 parts by mass of an organopolysiloxane resin microparticle having no hot-melt properties as a whole molecule, having at least one curing reactive functional group containing a carbon-carbon double bond in the molecule, and where 20 mol % or more of the total siloxane units of the organopolysiloxane resin microparticle is siloxane units represented by $SiO^{4/2}$, or
(A2-2-1) 15 to 100 parts by mass of a straight-chain diorganopolysiloxane represented by the following structural formula:

$$R^4{}_3SiO(SiR^4{}_2O)_kSiR^4{}_3$$

where each $R^4$ is independently a monovalent hydrocarbon group having 1 to 10 carbon atoms, except that at least two of the $R^4$ in one molecule are alkenyl groups, and k is a number from 20 to 5,000.

9. The curable granular silicone composition according to claim 1, wherein component (B) is selected from the group consisting of a reinforcing filler, a white pigment, a thermally conductive filler, an electrically conductive filler, a phosphor, and a mixture of at least two of these.

10. The curable granular silicone composition according to claim 1, wherein the content of component (B) ranges from 10 to 50 volume % of the entire composition.

11. The curable granular silicone composition according to claim 1, in a form of a pellet or a sheet.

12. A laminate body having a structure including a sheet-like member comprising the curable granular silicone composition according to claim 1 between two film-like substrates provided with a release layer.

13. The laminate body according to claim 12, wherein the sheet-like member comprising the curable granular silicone composition has a thickness of 1 mm or less and is a film-like adhesive.

14. A cured product obtained by curing the curable granular silicone composition according to claim 1.

15. A semiconductor device, comprising the cured product according to claim 14.

16. A method for manufacturing the curable granular silicone composition according to claim 1, wherein each component that makes up the curable granular silicone composition is granulated by mixing under temperature conditions not exceeding 50° C.

17. A method of molding a cured product, comprising the following steps:
(I) heating the curable granular silicone composition in the form of pellets or sheets according to claim 11 to a temperature of 100° C. or higher to melt;
(II) injecting the curable granular silicone composition in a liquid state obtained in step (I) into a mold or distributing the curable granular silicone composition obtained in step (I) to a mold by clamping; and
(III) curing the curable granular silicone composition injected or distributed in step (II).

18. A method for molding a cured product, comprising a coating process for overmolding and underfilling a semiconductor device using a cured product formed from the curable granular silicone composition according to claim 1.

19. The method for molding a cured product according to claim 18, comprising:
covering a surface of a semiconductor wafer substrate on which a single or plurality of semiconductor devices are mounted with a cured product produced by curing the curable granular silicone composition; and
overmolding so that a gap between the semiconductor devices is filled with the cured product.

* * * * *